(12) United States Patent
Kawanabe et al.

(10) Patent No.: US 11,856,659 B2
(45) Date of Patent: Dec. 26, 2023

(54) BOARD-LIKE STRUCTURE AND HEATER SYSTEM

(71) Applicant: KYOCERA Corporation, Kyoto (JP)

(72) Inventors: Yasunori Kawanabe, Kirishima (JP); Yoshihiro Okawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 310 days.

(21) Appl. No.: 17/285,012

(22) PCT Filed: Oct. 8, 2019

(86) PCT No.: PCT/JP2019/039687
§ 371 (c)(1),
(2) Date: Apr. 13, 2021

(87) PCT Pub. No.: WO2020/090379
PCT Pub. Date: May 7, 2020

(65) Prior Publication Data
US 2021/0298127 A1  Sep. 23, 2021

(30) Foreign Application Priority Data
Oct. 30, 2018  (JP) .................................. 2018-203805

(51) Int. Cl.
*H05B 3/28* (2006.01)
*H01L 21/67* (2006.01)
*H05B 3/12* (2006.01)

(52) U.S. Cl.
CPC ....... *H05B 3/283* (2013.01); *H01L 21/67103* (2013.01); *H05B 3/12* (2013.01); *H05B 2203/016* (2013.01)

(58) Field of Classification Search
CPC .............. H01L 21/02; H01L 21/67103; H05B 2203/013; H05B 2203/016; H05B 3/12; H05B 3/283
USPC ............................................ 219/443.1–468.2
See application file for complete search history.

(56) References Cited

U.S. PATENT DOCUMENTS

| 7,329,842 B2 * | 2/2008 | Kushihashi ....... H01L 21/67103 219/520 |
| 2003/0066608 A1 | 4/2003 | Natsuhara et al. |
| 2007/0257022 A1 * | 11/2007 | Lin .................... H05B 3/283 219/443.1 |
| 2018/0174878 A1 | 6/2018 | Kimura et al. |

FOREIGN PATENT DOCUMENTS

| JP | 2003-178937 A | 6/2003 |
| JP | 2003-308951 A | 10/2003 |

(Continued)

*Primary Examiner* — Sang Y Paik
(74) *Attorney, Agent, or Firm* — Procopio, Cory, Hargreaves & Savitch LLP

(57) ABSTRACT

A board-like structure includes a base body, an internal conductor, and a terminal member. The base body is an insulating member including an upper surface and a lower surface on an opposite side to the upper surface. The internal conductor runs along the upper surface and the lower surface inside the base body. The terminal member is at least partially located inside the base body, is exposed to an external portion of the base body at the lower surface, and is electrically connected to the internal conductor. The terminal member includes an insulating terminal base part and a conductor layer on a surfaces of the terminal base part.

19 Claims, 15 Drawing Sheets

(56) References Cited

FOREIGN PATENT DOCUMENTS

| | | | |
|---|---|---|---|
| JP | 2005-26120 | * | 1/2005 |
| JP | 2005-166451 | A | 6/2005 |
| JP | 2006-114250 | A | 4/2006 |
| JP | 2010-042967 | A | 2/2010 |
| JP | 2017-022284 | A | 1/2017 |

* cited by examiner

BOARD-LIKE STRUCTURE AND HEATER SYSTEM

TECHNICAL FIELD

The present disclosure relates to a board-like structure and a heater system including a board-like structure.

BACKGROUND ART

Known in the art is a power supply-use structure for supplying power to a ceramic heater or another board-like structure. For example, Patent Literature 1 (connection structure of a power supply-use electrode rod and a power supply-use terminal), Patent Literature 2 (wafer support), and Patent Literature 3 (power supply-use electrode member) are known.

CITATION LIST

Patent Literature

Patent Literature 1: Japanese Patent Publication No. 2003-308951
Patent Literature 2: Japanese Patent Publication No. 2017-22284
Patent Literature 3: Japanese Patent Publication No. 2003-178937

SUMMARY OF INVENTION

A board-like structure according to one aspect of the present disclosure includes an insulating base body, an internal conductor, and a terminal member. The base body includes an upper surface and a lower surface on an opposite side to the upper surface. The internal conductor runs along the upper surface and the lower surface inside the base body. The terminal member is at least partially located inside the base body, exposed to an external portion of the base body at the lower surface, and is electrically connected to the internal conductor. The terminal member includes an insulating terminal base part and a conductor layer on a surfaces of the terminal base part.

A heater system according to one aspect of the present disclosure includes the board-like structure described above and a power supply part which is electrically connected to the terminal member. The internal conductor is a resistance heating element.

DESCRIPTION OF EMBODIMENTS

Figure 1:
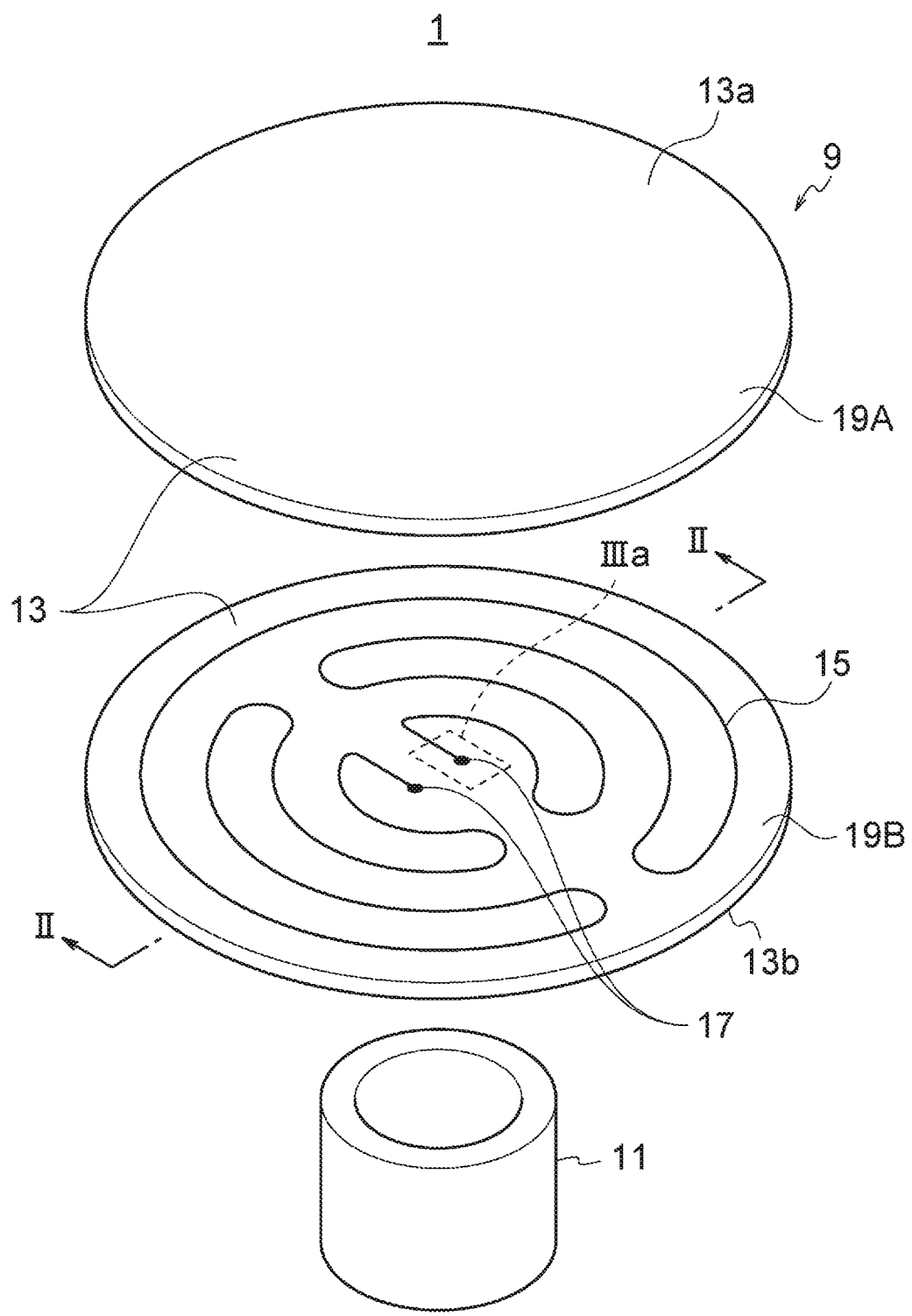
FIG. 1 is a schematic disassembled perspective view showing the configuration of a heater according to an embodiment.

Below, a board-like structure in the present disclosure will be explained by taking a heater plate in a ceramic heater as an example. The drawings referred to in the following explanations are schematic ones for convenience of explanation. Accordingly, sometimes details will be omitted. Further, the size ratios and the like will not always coincide with the actual ones. Further, the heater may be further provided with known components which are not shown in the drawings.

In the second and following embodiments, basically only different portions from those in the previously explained embodiments will be explained. The matters which are not particularly explained may be considered the same as those in the previously explained embodiments. Further, for convenience of explanation, sometimes configurations corresponding to each other among the plurality of embodiments will be assigned the same notations even if there are differences.

First Embodiment (Heater System)

Figure 2:
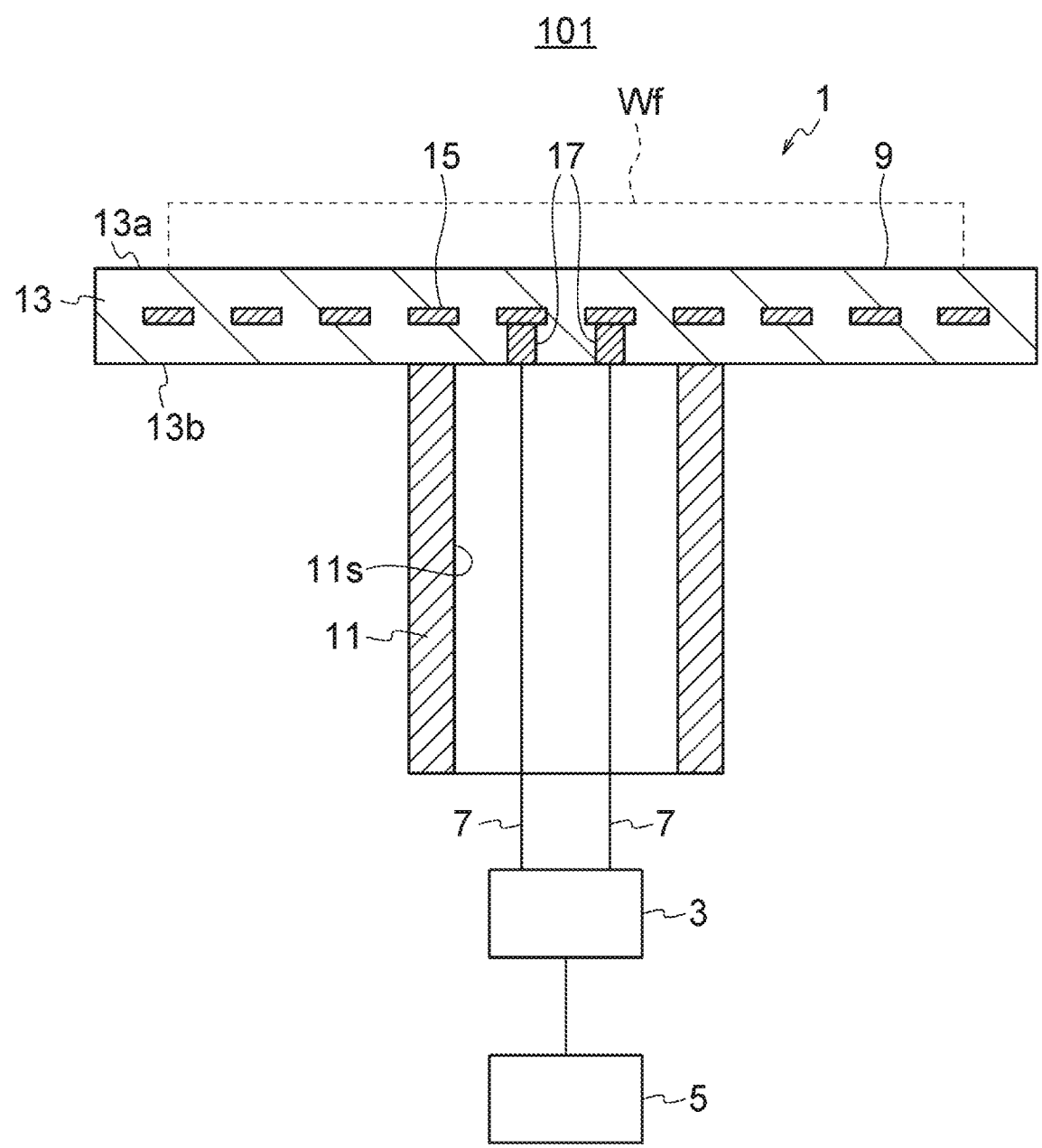
FIG. 2 is a cross-sectional view taken along the II-II line in FIG. 1.

FIG. 1 is a schematic disassembled perspective view showing the configuration of a heater 1 according to an embodiment. FIG. 2 is a schematic view showing the configuration of a heater system 101 including the heater 1 in FIG. 1. In FIG. 2, for the heater 1, a cross-sectional view along the II-II line in FIG. 1 is shown. FIG. 1 shows the heater 1 in a disassembled manner for convenience in order to show the structure of the heater 1. An actual heater 1 after completion need not be able to be disassembled as in the disassembled perspective view in FIG. 1.

The upper parts in the drawing sheets of FIG. 1 and FIG. 2 are for example vertically upward. However, the heater 1 need not be utilized assuming the upper parts in the drawing sheets of FIG. 1 and FIG. 2 are vertically upper parts. In the following explanation, for convenience, sometimes the "upper surface" and "lower surface" and other terms will be used where the upper parts in the drawing sheets of FIG. 1 and FIG. 2 are the vertically upper parts. When simply referred to as "when viewed on a plane", unless particularly explained otherwise, it designates "viewed from the upper parts in the drawing sheets of FIG. 1 and FIG. 2".

The heater system 101 has the heater 1, a power supply part 3 (FIG. 2) which supplies power to the heater 1, and a control part 5 (FIG. 2) which controls the power supply part 3. The heater 1 and the power supply part 3 are connected by wiring members 7 (FIG. 2). Note that, the wiring members 7 may be grasped as portions of the heater 1. Further, the heater system 101, other than the configurations explained above, for example, may have a fluid supply part which supplies gas and/or liquid to the heater 1.

(Heater)

The heater 1 for example has a substantially plate-shaped (disk-shaped in the example shown) heater plate 9 (one example of the board-like structure) and a pipe 11 which extends downward from the heater plate 9.

The heater plate 9 has a wafer Wf (FIG. 2) placed (superposed) on its upper surface 13a as one example of a heated object and directly contributes to heating of the wafer. The pipe 11 for example contributes to support of the heater plate 9 and protection of the wiring members 7. Note that, only the heater plate 9 may be grasped as the heater.

(Heater Plate)

The upper surface 13a and lower surface 13b of the heater plate 9 are for example substantially flat surfaces. The planar shape and various dimensions of the heater plate 9 may be suitably set considering the shape and dimensions etc. of the heated object. For example, the planar shape is circular (example shown) or polygonal (for example rectangular). When showing one example of the dimensions, the diameter is 20 cm to 35 cm, and the thickness is 4 mm to 30 mm.

The heater plate 9 is for example provided with an insulating base body 13, a heat generating element 15 (one example of the internal conductor) buried in the base body 13, and terminal parts 17 for supplying power to the resistance heating element 15. By flow of current in the resistance heating element 15, heat is generated according to Joule's law and in turn the wafer placed on the upper surface 13a of the base body 13 is heated.

(Base Body)

The outer shape of the base body 13 forms the outer shape of the heater plate 9. Accordingly, the explanation relating to the shape and dimensions of the heater plate 9 explained above may be grasped as an explanation of the outer shape and dimensions of the base body 13 as it is. The material of the base body 13 is for example ceramic. The ceramic is for example a sintered body containing aluminum nitride (AlN), aluminum oxide ($Al_2O_3$, alumina), silicon carbide (SiC) silicon nitride ($Si_3N_4$) or the like as the principal ingredient. Note that, the principal ingredient is for example an ingredient accounting for 50 mass % or more or 80 mass % or more of the material (same is true for the other members and other materials unless particularly explained otherwise).

In FIG. 1, the base body 13 is configured by a first insulation layer 19A and second insulation layer 19B. Note that, the base body 13 may be prepared by materials forming the first insulation layer 19A and second insulation layer 19B (for example ceramic green sheets) stacked on each other or may be prepared according to a method different from such a method and may be only conceptually grasped to be configured by the first insulation layer 19A and second insulation layer 19B due to the presence of the resistance heating element 15 etc. after completion.

(Resistance Heating Element)

The resistance heating element 15 extends along (for example parallel to) the upper surface 13a and the lower surface 13b of the base body 13. Further, the resistance heating element 15, when viewed on a plane, for example, extends covering over substantially the entire surface of the base body 13. In FIG. 1, the resistance heating element 15 is positioned between the first insulation layer 19A and the second insulation layer 19B.

The specific pattern (route) of the resistance heating element 15 when viewed on a plane may be made a suitable one. For example, only one resistance heating element 15 is provided in the heater plate 9 and extends from one end to the other end without crossing itself. Further, in the example shown, the resistance heating element 15, in each of the regions obtained by dividing the heater plate 9 into two, extends so as to weave back and forth (meander) in a circumferential direction. Other than this, for example, the resistance heating element 15 may spirally extend or may extend so as to linearly weave back and forth in one radial direction.

The shape when locally viewing the resistance heating element 15 may be made a suitable one. For example, the resistance heating element 15 may be a layered conductor which is parallel to the upper surface 13a and lower surface 13b, may be coil shaped (spring shaped) wound using the above route as the axis, or may be formed in a mesh shape. Also, the dimensions in the various shapes may be suitably set. However, in the explanations of the various embodiments, as shown in FIG. 2, a case where the resistance heating element 15 is a layered conductor parallel to the upper surface 13a and the lower surface 13b will be taken as an example.

The material of the resistance heating element 15 is a conductor (for example metal) which generates heat by flow of current. The conductor may be suitably selected. For example, it is tungsten (W), molybdenum (Mo), platinum (Pt), indium (In), or an alloy containing them as principal constituents. Further, the material of the resistance heating element 15 may be one obtained by firing a conductive paste including the metal as described before. That is, the material of the resistance heating element 15 may be one containing glass powder and/or ceramic powder (from another viewpoint, an inorganic insulation substance) or other additives.

(Terminal Parts (Outline))

The terminal parts 17, for example, are connected to the two ends of the resistance heating element 15 in the long direction and, at the positions of the two ends, pass through parts of the base body 13 on the lower surface 13b side (second insulation layer 19B) to be exposed from the lower surface 13b. Due to this, it becomes possible to supply power from the exterior of the heater plate 9 to the resistance heating element 15. The pair of terminal parts 17 (two ends of the resistance heating element 15) are for example positioned on the center side in the heater plate 9. Note that, three or more terminal parts 17 supplying power to one resistance heating element 15 may be provided or two or more sets of terminal parts 17 supplying power to two or more (for example two or more layers of) resistance heating elements 15 may be provided.

(Pipe)

The pipe 11 is hollow shape opened at the top and bottom (two sides in the axial direction). From another viewpoint, the pipe 11 has a space 11s running through it from the top to bottom. The shapes of a transverse cross-section (cross-section perpendicular to the axial direction) and longitudinal cross-section (cross-section parallel to the axial direction, the cross-section shown in FIG. 2) in the pipe 11 may be suitably set. In the example shown, the pipe 11 is cylinder shaped with a constant diameter relative to the position in the axial direction. Naturally, the pipe 11 may differ in diameter according to the position in the height direction. Further, specific values of dimensions of the pipe 11 may be suitably set. Although not particularly shown, in the pipe 11, a channel in which gas or liquid flows may be formed.

The pipe 11 may be configured by ceramic or another insulation material or may be configured by a metal (conductive material). As specific materials of the ceramic, for example, ones (AlN etc.) given in the explanation of the base body 13 may be utilized. Further, the material of the pipe 11 may be the same as the material of the base body 13 or may be different from the latter.

The base body 13 and the pipe 11 may be fixed together out by a suitable method. For example, the two may be fixed together by an adhesive (not shown) interposed between the two, may be fixed together by solid phase bonding without an adhesive interposed between the two, or may be mechanically fixed together by utilizing bolts and nuts (both not shown).

(Wiring Members)

The wiring members 7 are inserted in the space 11s in the pipe 11. In a plane perspective, the plurality of terminal parts 17 are exposed from the base body 13 in a region in the heater plate 9 which is exposed to the space 11s. Further, the wiring members 7 are connected at single ends to the plurality of terminal parts 17.

The plurality of wiring members 7 may be flexible electrical wires, may be rod-shaped conductors without flexibility, or may be a combination of the same. Further, the plurality of flexible electrical wires may be bundled together so as to become like one cable or need not be bundled together.

Further, the connections between the wiring members 7 and the terminal parts 17 may be suitable ones. For example, the two may be joined by a conductive bonding material. Further, for example, the two may be screwed together by forming a male screw in one and forming a female screw in the other. The terminal parts 17 may have specific shapes for connection with the wiring members 7 like the screws explained before. In the following explanation, however, illustration of such specific shapes will be basically omitted.

(Details of Terminal Parts)

Figure 3A:
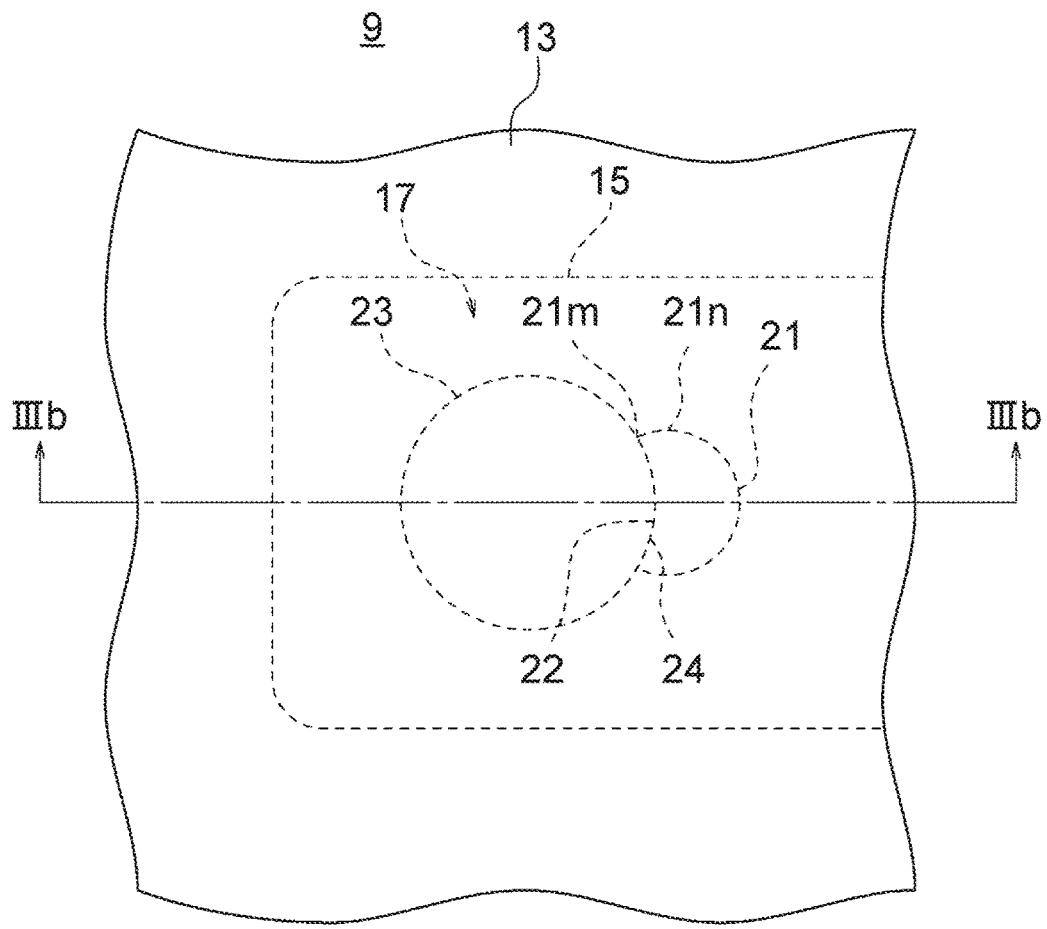
FIG. 3A is a plan view of a terminal part in a heater according to a first embodiment.
Figure 3B:
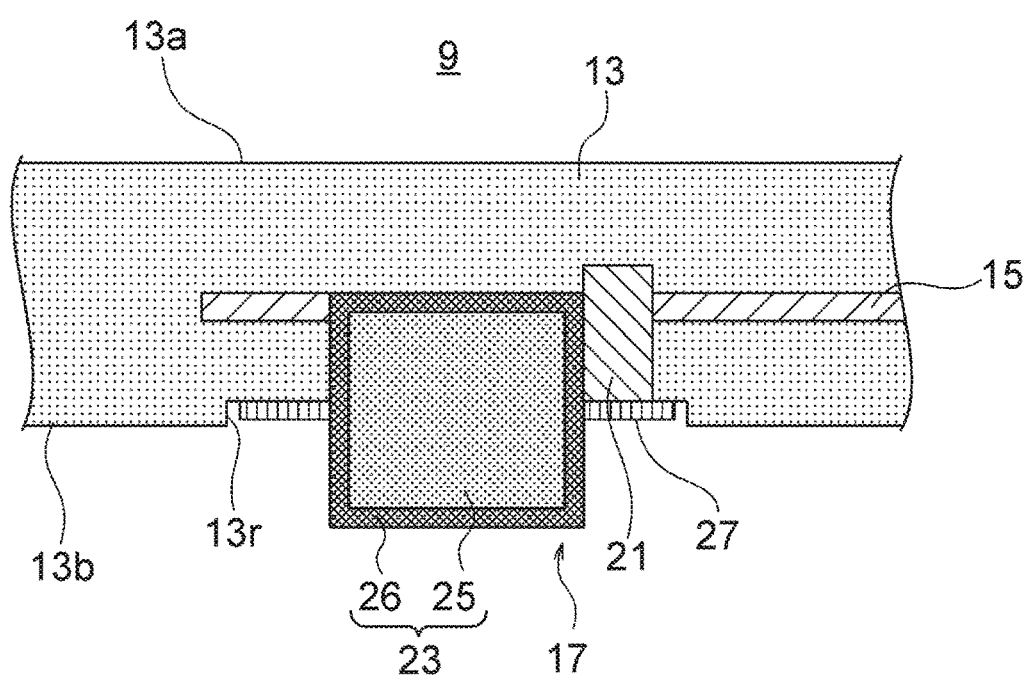
FIG. 3B is a cross-sectional view taken along the IIIb-IIIb line in FIG. 3A.

FIG. 3A is a plan view showing a region IIIa in FIG. 1 in an enlarged manner. FIG. 3B is a cross-sectional view taken along the IIIb-IIIb line in FIG. 3A. In these views, the resistance heating element 15 extends from the left side in the drawing sheet to the right side in the drawing sheet.

Each terminal part 17 has a connection conductor 21 which is connected to the resistance heating element 15 and a terminal member 23 which is connected to the connection conductor 21. The terminal member 23 is the portion connected with the wiring member 7. The terminal part 17 is not configured by one metal member. The terminal part 17 is configured by the connection conductor 21 and the terminal member 23. Due to this, various effects are exhibited as will be explained later.

(Terminal Member)

Each terminal member 23 for example has an insulating terminal base part 25 and a conductor layer 26 which is positioned on the surface of the terminal base part 25. That is, the terminal member 23 has a configuration having conductivity on its surface. Further, the terminal member 23 is formed in a shape having a certain extent of length in the vertical direction (thickness direction of the base body 13).

The terminal member 23 is for example buried in the base body 13 so that at least a portion of the terminal member 23 on the upper side (side of internal portion of the base body 13) vertically passes through at least a portion in the base body 13 on the lower surface 13b side. Due to this, the terminal member 23 is held upon the base body 13 and becomes able to be connected to the connection conductor 21 which is positioned inside the base body 13.

Further, a portion of the terminal member 23 on the lower surface side (side away from the resistance heating element 15) is exposed from the lower surface 13b of the base body 13. Due to this, the terminal member 23 becomes able to be connected to the wiring member 7. Note that, in the present disclosure, when referring to "the terminal member 23 is exposed from the lower surface 13b of the base body 13", that exposed portion may be hidden from the external portion by the wiring member 7 and/or a not shown bonding material for connecting the wiring member 7 and the terminal member 23 or the like.

The specific shape and various dimensions of the terminal member 23 may be suitably set. For example, as in the example shown, the terminal member 23 may be column-shaped so as to linearly extend in the vertical direction (thickness direction of the base body 13). The terminal member 23 may be solid as in the example shown or may be hollow unlike the example shown. Further, although not particularly shown, the terminal member 23 may be rod-shaped so as to extend out of the lower surface 13b and have a relatively long length. For example, the length of the outward extension of the terminal member 23 from the lower surface 13b may be made 2 times or more or 5 times or more of the thickness of the base body 13.

Further, for example, the shape and size of the transverse cross-section of the terminal member 23 parallel to the base body 13 may be constant or may not be constant in the vertical direction (thickness direction of the base body 13). The shape of the transverse cross-section may be circular or polygonal or another suitable shape. However, in the explanations of the various embodiments, as illustrated, a case where it is circular will be taken as an example.

Further, when viewed on a plane, the relative size and position etc. of the terminal member 23 relative to the resistance heating element 15 may be suitably set. For example, the diameter of the terminal member 23 in the width direction of the resistance heating element 15 may be smaller than (example shown), may be equal to, or may be larger than (see FIG. 8) the width of the resistance heating element 15. In the width direction of the resistance heating element 15, the terminal member 23 may go in the resistance heating element 15 in its entirety (example shown) or may not go in (see FIG. 8). The center of the terminal member 23 may be positioned at substantially the center of the resistance heating element 15 in the width direction (example shown) or may not be positioned there. Note that, in the explanation of the present embodiment, as illustrated, an example where the diameter of the terminal member 23 is smaller than the width of the resistance heating element 15, and the terminal member 23 goes in the width of the resistance heating element 15 will be taken as an example.

The position etc. of the terminal member 23 in the vertical direction relative to the base body 13 may be suitably set. For example, the upper surface of the terminal member 23 may be positioned higher than the resistance heating element 15 and contact the base body 13 (example shown). Further, for example, the upper surface of the terminal member 23 may contact the lower surface or internal portion of the resistance heating element 15 (see FIG. 4B). In other words, the upper surface of the terminal member 23 may be connected or may not be connected to the resistance heating element 15. Further, although not particularly shown, the upper surface of the terminal member 23 may be positioned lower than the lower surface of the resistance heating element 15 and contact the base body 13.

Further, for example, the lower surface of the terminal member 23 may be positioned lower than the lower surface 13*b* of the base body 13 (in more detail, the bottom surface of a later explained recessed portion 13*r*) as in the example shown. From another viewpoint, the terminal member 23 may project from the lower surface 13*b* so that not only the lower surface, but also the side surface of a portion on lower side is exposed from the base body 13. Further, unlike the example shown, the lower surface of the terminal member 23 may be flush with the lower surface 13*b* or may be positioned higher than the lower surface 13*b*. In these cases, the terminal member 23 is exposed from the base body 13 only in its lower surface.

(Terminal Base Part)

In the terminal member 23, the conductor layer 26 is formed relatively thin. The terminal base part 25 accounts for the majority of the volume of the terminal member 23. Alternatively or simultaneously, the conductor layer 26 is formed with substantially a constant thickness. The shape and size of the terminal base part are a shape and size one degree smaller the shape and size of the terminal member 23 (substantially similar shapes). Accordingly, the explanation concerning the shape and size etc. of the terminal member 23 which was described above or will be explained later may be grasped as the explanation of the terminal base part 25. However, the conductor layer 26 may be made one that exerts an influence upon the shape and size of the terminal member 23.

The ratio of the terminal base part 25 in the terminal member 23 may be suitably set. For example, the terminal base part may account for 60% or more, 70% or more, 80% or more, 90% or more, or 95% or more of the volume of the terminal member 23. Further, for example, the diameter of the terminal base part 25 may account for 70% or more, 80% or more, 90% or more, or 95% or more of the diameter of the terminal member 23.

The material of the terminal base part 25 is for example a material having a thermal expansion coefficient closer to the material of the base body 13 compared with the material of the conductor layer 26 and/or connection conductor 21. The material of the base body 13 is usually smaller in thermal expansion coefficient than the material of the conductor layer 26 and/or connection conductor 21. Accordingly, from another viewpoint, the material of the terminal base part 25 is smaller in thermal expansion coefficient compared with the material of the conductor layer 26 and/or connection conductor 21. Further, for example, the material of the terminal base part 25 is lower in heat conductivity compared with the material of the conductor layer 26 and/or connection conductor 21. As the material of the terminal base part 25, for example, there can be mentioned ceramic. The ceramic may have for example the same principal ingredient as the principal ingredient of the ceramic configuring the base body 13.

(Conductor Layer)

The conductor layer 26 is for example made thinner compared with the size of the terminal member 23 as already explained. While counting backward from the size of the terminal base part 25 described above, when describing this for safety's sake, for example, the volume of the conductor layer 26 may be made 40% or less, 30% or less, 20% or less, 10% or less, or 5% or less of the volume of the terminal member 23. Further, for example, the thickness of the conductor layer 26 may be made 15% or less, 10% or less, 5% or less, or 2.5% or less of the diameter of the terminal member 23 (for example the maximum diameter when not circular) and/or the length of the terminal member 23 in the vertical direction.

Further, the conductor layer 26 is for example given substantially a constant thickness over its entirety as already explained. However, in the conductor layer 26, the thicknesses at the side surface, upper surface, and lower surface of the terminal member 23 may be mutually different. The conductor layer 26 for example covers the entirety of the surface of the terminal member 23. However, although not particularly shown, the conductor layer 26 need not cover a portion of the terminal base part 25. For example, in a case where the upper surface of the terminal member 23 is not utilized for conduction with the resistance heating element 15 (or connection conductor 21), the conductor layer 26 need not cover the upper surface of the terminal base part 25.

The material of the conductor layer 26 may be suitably set. For example, the material of the conductor layer 26 may be a material which is the same as or contains the same principal ingredients as the material of the internal conductor (resistance heating element 15) and/or material of the wiring member 7, or may not be such a material either. In a case where the materials are the same or the principal ingredients are the same, for example, heat stress generated between these conductors can be reduced. As the material of the conductor layer 26, there can be mentioned for example Ag, Pt, Pd, W, or Mo. Further, as the material of the conductor layer 26, use may be made of a material having a relatively high oxidation resistance. For example, the material of the conductor layer 26 may be made a metal having an ionization tendency not more than Ni. As such a metal, for example, there can be mentioned Ni, Ag, Pt, and Pd. The conductor layer 26 may be configured by two or more conductor layers which are made of mutually different materials. In this case, between the two or more conductor layers, only one layer may be configured from the material as explained above.

(Connection Conductor)

The connection conductor 21 is for example configured in its entirety by a conductor (for example metal). Further, it is formed in a shape having a certain extent of length in the thickness direction of the base body 13. In the connection conductor 21, for example, at least a portion thereof is buried in the base body 13. Due to this, the connection conductor 21 is held upon the base body 13 and becomes able to be connected to the resistance heating element positioned inside the base body 13.

The specific shape and various dimensions etc. of the connection conductor 21 may be suitably set. For example, as in the example shown, the connection conductor 21 may be column-shaped so as to linearly extend in the thickness direction of the base body 13. The connection conductor 21 may be solid as in the example shown or may be hollow unlike the example shown. Further, for example, the shape and size of the transverse cross-section of the connection conductor 21 parallel to the base body 13 may be constant or may not be constant in the thickness direction of the base body 13.

Figure 4A:
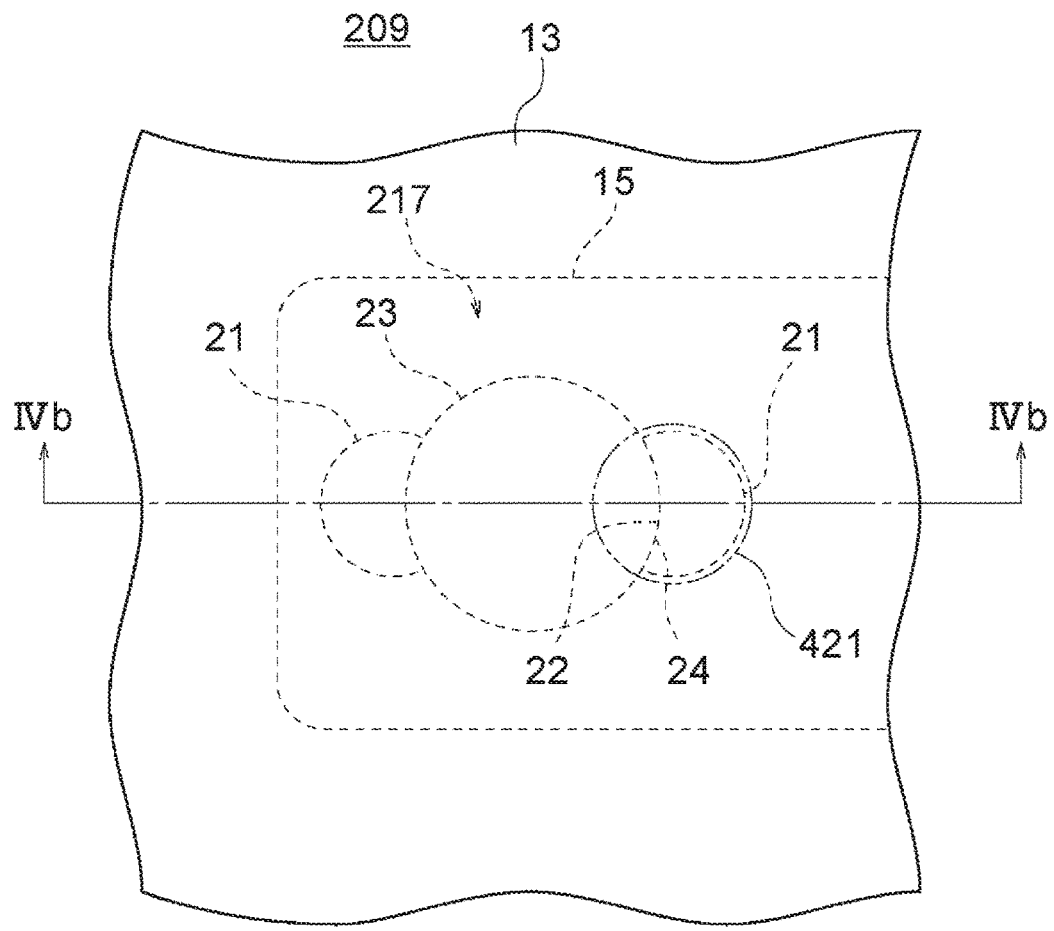
FIG. 4A is a plan view of a terminal part in a heater according to a second embodiment.
Figure 4B:
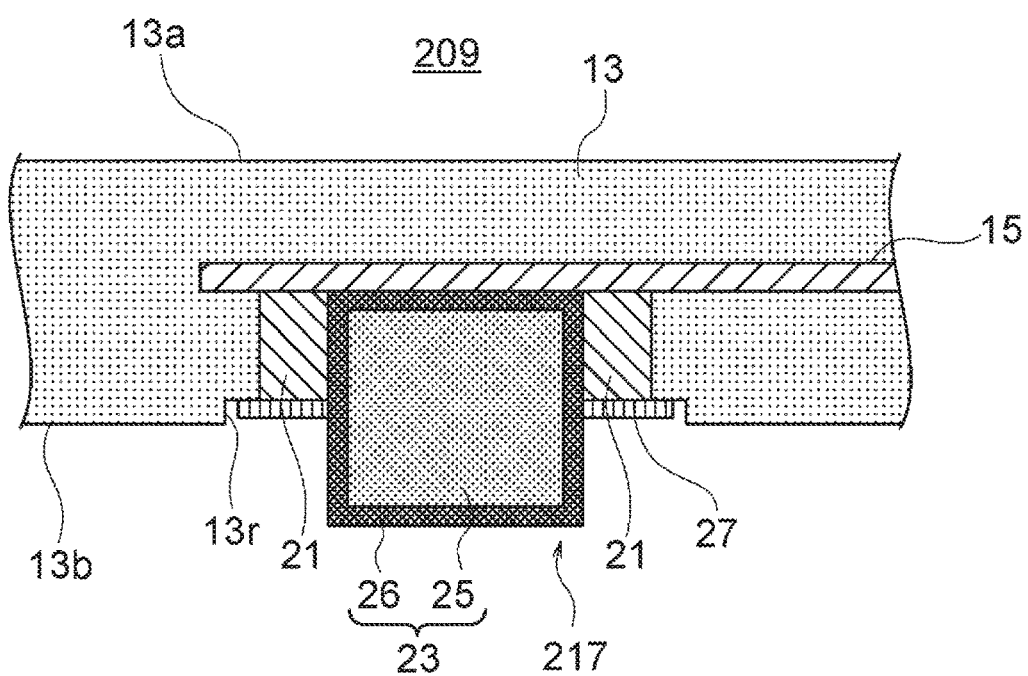
FIG. 4B is a cross-sectional view taken along the IVb-IVb line in FIG. 4A.

The connection conductor 21, as in the example shown, may be connected at its side surface with the resistance heating element or may be connected at its upper surface with the resistance heating element 15 (see FIG. 4B). In the former case, the connection conductor 21 may pass through the resistance heating element 15 in the vertical direction (thickness direction of the base body 13) as in the example shown or may not pass through the same (when viewed on a plane, the connection conductor 21 may be adjacent to the resistance heating element 15). Further, in a mode where the connection conductor 21 passes through the resistance heating element 15, the connection conductor 21 may be connected to the resistance heating element 15 over the entire circumference around the connection conductor 21 when viewed on a plane or may be connected in only a portion with the resistance heating element (example shown). Note that, although not particularly shown, in a mode where the connection conductor 21 is connected to the resistance heating element 15 over its entire circumference, the terminal member 23 is positioned lower than the resistance heating element 15. Further, although not particularly shown, when the resistance heating element 15 is coil-shaped, it is also possible to connect both of the upper surface and side surface of the connection conductor 21 to the resistance heating element 15.

In the connection conductor 21, its length in the vertical direction (thickness direction of the base body 13) is made longer than the thickness of the resistance heating element 15 (length in the vertical direction). Note that, when the resistance heating element is coil-shaped, the "thickness" of the resistance heating element referred to here means not a coil diameter, but a diameter in the vertical direction of a wire material configuring the coil. The length of the connection conductor 21 in the vertical direction is for example 2 times or more, 5 times or more, 10 times or more, or 100 times or more of the thickness of the resistance heating element 15. Further, the connection conductor 21 for example has at least a portion which is positioned lower than the resistance heating element 15. Further, for example, when viewed on a plane, the diameter of the terminal member 23 in the width direction of the resistance heating element 15 may be smaller than (example shown), may be equal to, or may be larger than the width of the resistance heating element 15. However, in the explanations of the various embodiments which will be given later, except for some embodiments, as illustrated, a case where the diameter of the terminal member 23 is smaller than the width of the resistance heating element 15 will be taken as an example.

The connection conductor 21 and the terminal member 23 are for example connected in at least their side surfaces to each other. The length of the mutual connection region of the side surfaces in the vertical direction (thickness direction of the base body 13) and the position in the vertical direction and the like may be suitably set. For example, the length of the connection region in the vertical direction may be made larger than the thickness of the resistance heating element 15 (length in the vertical direction). Further, the connection region of the connection conductor 21 and the terminal member 23 may be positioned in a portion of the connection conductor 21 in the vertical direction (example shown) or may extend over the entirety of the connection conductor 21 (see FIG. 4B). Further, the connection region, for example, may be positioned at a portion of the terminal member 23 in the vertical direction (example shown). Although not particularly shown, the connection region may extend over the entirety of the terminal member 23.

Figure 7A:
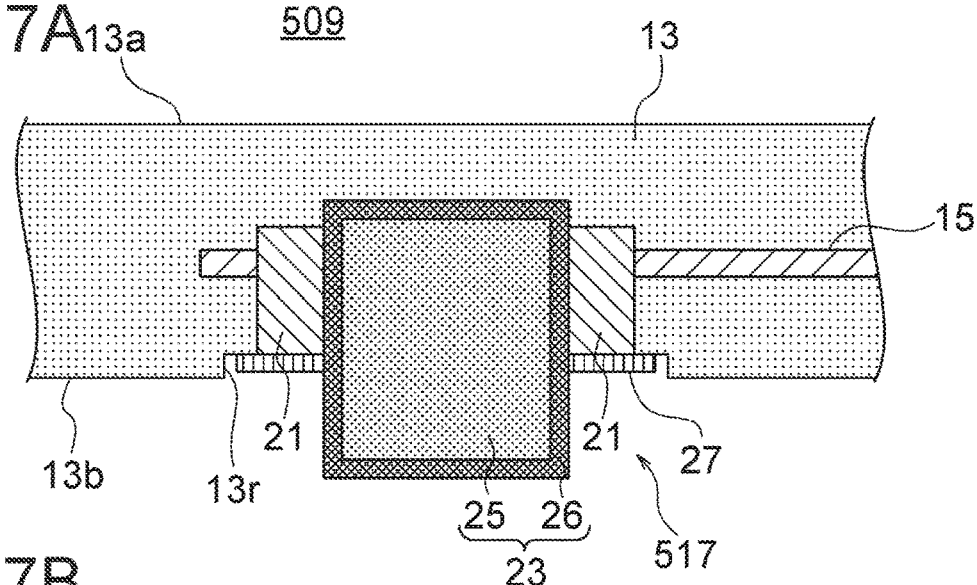
FIG. 7A, FIG. 7B, and FIG. 7C are cross-sectional views of terminal parts in heaters according to a fifth embodiment, a modification, and another modification.

From another viewpoint, the upper surface of the connection conductor 21 may be positioned higher than the upper surface of the terminal member 23 (example shown), may be flush with the upper surface of the terminal member 23 (see FIG. 4B), or may be positioned lower than the upper surface of the terminal member 23 (see FIG. 7A). Further, the lower surface of the connection conductor 21 may be positioned higher than the lower surface of the terminal member 23 (example shown). Although not particularly shown, the lower surface of the connection conductor 21 may be flush with the lower surface of the terminal member 23 or may be positioned lower than the lower surface of the terminal member 23. Further, the length of the connection conductor 21 in the vertical direction may be shorter than the length of the terminal member 23 in the vertical direction as in the example shown. Although not particularly shown, the length of the connection conductor 21 in the vertical direction may be equal to or greater than the length of the terminal member 23 in the vertical direction.

The connection conductor 21, for example, when viewed on a plane, is positioned only in a partial range of the circumferential direction centered about the terminal member 23. In turn, the connection conductor 21 is connected with respect to only a part of the circumferential direction centered about the terminal member 23 in the side surface of the terminal member 23. In the direction around the terminal member 23, the size of the (one) connection conductor 21 or the size of the region where the (one) connection conductor 21 and the terminal member 23 are connected may be suitably set. For example, these sizes may be made 20° or more, 40° or more, 60° or more, or 80° or more in terms of central angle around the terminal member 23. Further, these sizes may be made 90° or less, 80° or less, 60° or less, or 40° or less. The above lower limits and upper limits may be suitably combined unless they are contradictory.

From another viewpoint, in the side surface of the terminal member 23, a portion overlapping the side surface of the connection conductor 21 in the vertical direction has a non-connection area where it is not connected with the side surface of the connection conductor 21. Here, in the present embodiment, a mode where the terminal member 23 goes in the width of the resistance heating element 15 when viewed on a plane and the terminal member 23 passes through the resistance heating element 15 is taken as an example. Accordingly, in the above non-connection area, a portion in the vertical direction is connected to the resistance heating element 15 directly or through a not shown bonding material (conductive film). Further, in the above non-connection area, the portion which is not connected to the resistance heating element contacts the base body 13. Note that, although not particularly shown, in a case where the resistance heating element 15 is coil-shaped or the like, it is also possible to connect both of the upper surface and side surface of the terminal member 23 with the resistance heating element.

The shape of the connection region of the connection conductor 21 and the terminal member 23 may be a curved surface (example shown) or a planar shape. In the example shown, when viewed on a plane, the terminal member 23 has a projecting portion 24 (projecting surface), the connection conductor 21 has a recessed portion 22 (recessed surface), and the projecting portion 24 and the recessed portion 22 are connected to each other. In more detail, the projecting portion 24 is for example a portion (arc) of the circular shaped terminal member 23 when viewed on a plane. The recessed portion 22 has a shape which substantially matches with the projecting portion 24 (arc having substantially an equal curvature as that of the later). Further, the projecting portion 24 is fit in the recessed portion 22. Specific values of the curvatures of the projecting portion 24 and the recessed portion 22 may be suitably set.

When viewed on a plane, the area of the (one) connection conductor 21 is for example made smaller than the area of the terminal member 23. Further, the area of the connection conductor 21 is reduced due to formation of the recessed portion 22 as explained above. However, for example, even if the recessed portion 22 is not formed, the area of the connection conductor 21 is made smaller than the area of the terminal member 23. In other words, the diameter of the connection conductor 21 (for example the maximum diameter when a circular shape cannot be envisioned) is smaller than the diameter of the terminal member 23 (for example the maximum diameter when not circular). For example, the area of the connection conductor 21 which is reduced or not reduced by the recessed portion 22 may be made 9/10 or less, 2/3 or less, 1/2 or less, or 1/3 or less of the area of the terminal member 23. However, although not particularly shown, the area of the (one) connection conductor 21 may be made not less than the area of the terminal member 23.

The relative position of the connection conductor 21 relative to the terminal member 23 may be suitably set. In the example shown, the connection conductor 21 is arranged in the direction of extension of the resistance heating element 15 relative to the terminal member 23. Note that, in the example shown, the connection conductor 21 is positioned on the opposite side to the end part of the resistance heating element 15 relative to the terminal member 23. However, the connection conductor 21 may be positioned on the end part side of the resistance heating element relative to the terminal member 23. Further, the direction of arrangement of the connection conductor 21 and the terminal member 23 may intersect (be inclined or perpendicular) with respect to the direction in which the resistance heating element 15 extends.

The shapes of portions in the connection conductor 21 which are not connected to the terminal member 23 and the like may be made suitable ones. For example, in the example shown, when viewed on a plane, the connection conductor 21 is given shaped with the recessed portion 22 explained above formed in a circular shape. That is, the shape of the side surface in the connection conductor 21 which is not connected to the terminal member 23 is an arc shape. The diameter of that is for example smaller than the diameter of the terminal member 23. Further, the central angle of the arc is for example 180° or more.

From another viewpoint, the connection conductor 21 has a first portion 21m which is connected with the terminal member 23 and a second portion 21n which is positioned on the opposite side to the terminal member 23 relative to the first portion 21m. Further, the second portion 21n is larger in the width in the direction perpendicular to the arrangement direction of the connection conductor 21 and terminal member 23 than that of the first portion 21m. Accordingly, the second portion 21n abuts (engaged) with the base body 13 toward the terminal member 23 side.

Note that, the shape of the transverse cross-section (cross-section parallel to the base body 13) of the connection conductor 21 may be a shape other than a circular shape, for example, may be an ellipse or polygon when assuming that the recessed portion 22 is not formed. Further, a shape that has the second portion 21n abutting with the base body 13 toward the terminal member 23 side as explained above can be realized by not only a shape forming the recessed portion 22 in a circular shape, but a shape forming the recessed portion 22 in an ellipse or polygon or a shape without formation of the recessed portion 22.

The position of the connection conductor 21 in the vertical direction relative to the base body 13 and the like may be suitably set. For example, the lower surface of the connection conductor 21 may be made flush with (example shown), may be positioned lower (see FIG. 11A) than, or may be positioned higher than the lower surface 13b of the base body 13 (in more detail, the bottom surface of a recessed portion 13r which will be explained later). Further, the lower surface of the connection conductor 21 may be exposed from the base body 13 or may be buried in the base body 13.

The material of the connection conductor 21 may be suitably set. For example, the material of the connection conductor 21 may be a material which is the same as or contains the same principal ingredients as the material of the internal conductor (resistance heating element 15), material of the conductor layer 26 of the terminal member 23 and/or material of the wiring member 7 or may not be such a material. In a case where the materials are the same or the principal ingredients are the same, for example, heat stress generated between these conductors can be reduced. As the material of the connection conductor 21, for example, W, Mo, or Pt can be mentioned.

FIG. 3A and FIG. 3B clearly show the boundary of the connection conductor 21 and the terminal member 23 (conductor layer 26). However, by the two being configured by the same materials or similar materials, the boundary of the two may not be clear either. Even in this case, for example, the presence of the two can be identified from the shapes of the connection conductor 21 and the terminal member 23. Further, conversely, in a case where the presence of the two cannot be identified from the shapes of the connection conductor 21 and the terminal member 23, the two may be identified from the viewpoint of the materials. Further, in any case, the presence of the two may be identified predicated on the connection conductor 21 and the terminal member 23 being separately prepared in the manufacturing process. The same is true for the other members relative to each other.

(Rest of Configuration Relating to Terminal Part)

The lower surface 13b of the base body 13 may have a recessed portion 13r near the terminal part 17. The recessed portion 13r for example has a size large enough to allow the terminal member 23 and connection conductor 21 to go in the recessed portion 13r when viewed on a plane. The planar shape and depth etc. of the recessed portion 13r may be suitably set. The recessed portion 13r for example contributes to easing of polishing of the lower surface 13b (region other than the recessed portion 13r) in the manufacturing process of the heater plate 9.

Further, on the periphery of the terminal part 17 (or the periphery of the terminal member 23) at the lower surface 13b, a sealing material 27 may be provided. In the example shown, the sealing material 27 is adhered to the side surface of the terminal member 23, the lower surface 13b of the base body 13 (strictly speaking, the bottom surface of the recessed portion 13r), and the lower surface of the connection conductor 21. Due to this, for example, a gap between the terminal member 23 and the base body 13 and a gap between the terminal member 23 and the connection conductor 21 and/or gap between the connection conductor 21 and the base body 13 are sealed. The material of the sealing material 27 may be made a suitable one. For example, it may be a general glass seal or use may be made of a CaO—$Al_2O_3$—$Y_2O_3$ bonding agent.

As explained above, in the present embodiment, the board-like structure (heater plate 9) has the base body 13, internal conductor (resistance heating element 15), and terminal members 23. The base body 13 is an insulating member having the upper surface 13a and the lower surface 13b on the opposite side to the upper surface 13a. The resistance heating element 15 runs along the upper surface 13a and the lower surface 13b inside the base body 13. Each terminal member 23 is at least partially positioned inside the base body 13, is exposed to the external portion of the base body 13 at the lower surface 13b, and is electrically connected to the resistance heating element 15. The terminal member 23 has the insulating terminal base part 25 and the conductor layer 26 positioned on the surface of the terminal base part 25.

Usually, a conductor has a larger thermal expansion coefficient than an insulator. Accordingly, by using an insulator in the internal portion of terminal member 23 as explained above, for example, compared with a case where the entirety of the terminal member 23 is configured by metal, the difference between the thermal expansion coefficient of the entirety of the terminal member 23 and the thermal expansion coefficient of the base body 13 can be reduced. In turn, heat stress generated between the terminal member 23 and the base body 13 is reduced and thus a probability of occurrence of cracks etc. in the base body 13 can be lowered. Further, for example, the volume of metal in the area of the terminal part 17 in the heater plate 9 can be reduced. On the other hand, a conductor usually has a higher heat conductivity than an insulator. Accordingly, for example, a local rise of the heat conductivity in the heater plate 9 due to the provision of the terminal part 17 can be reduced. In this way, in the present embodiment, the configuration of the terminal is optimized.

Further, in the present embodiment, the base body 13 is made of a ceramic. The terminal base part 25 is made of a ceramic which is common in principal ingredients to the material configuring the base body 13. In this case, for example, the above effect of reducing the heat stress and/or effect of reducing a local rise of heat conductivity is improved.

Further, in the present embodiment, the heater plate 9 has the connection conductor 21. The connection conductor 21 is connected to the resistance heating element 15 inside the base body 13. The terminal member 23 is connected to the connection conductor 21 inside the base body 13 and is exposed to the external portion of the base body 13 at the lower surface 13b. The connection conductor 21 is longer in length in the vertical direction than the thickness of the resistance heating element 15 in the vertical direction. The terminal member 23 is connected in at least the side surface with the side surface of the connection conductor.

In this case, for example, the connection conductor 21 can be configured so as to be suitable for connection with the resistance heating element 15, and the terminal member 23 can be configured so as to be suitable for connection with the external portion of the heater plate 9. That is, it is made easy to optimize the terminal. From another viewpoint, the degree of freedom of design of the terminal is improved. As a result, for example, the following configurations can be employed to obtain various effects.

In the present embodiment, when viewed on a plane, the connection conductor 21 is positioned in only a partial range of the circumferential direction centered about the terminal member 23. Only a portion in the side surface of the terminal member 23 is connected to the connection conductor 21.

In this case, for example, compared with a conventional terminal part without provision of the connection conductor 21 where the diameter of the terminal member 23 is made larger, increase of the surface area of the terminal part 17 relative to the volume of the terminal part 17 is easy. As a result, for example, the reliability concerning fixation of the terminal part 17 with respect to the base body 13 and/or reliability of conduction between the terminal part 17 and the resistance heating element 15 can be improved. Further, for example, it is also easy to make the shape of the entirety of the terminal part 17 a shape with the direction of extension of the resistance heating element 15 made the long direction. In turn, it is easy to secure the contact area of the terminal part 17 with the resistance heating element 15.

Further, in the present embodiment, the connection conductor 21 has the first portion 21m and second portion 21n. The first portion 21m is connected to the terminal member 23. The second portion 21n is positioned on the opposite side to the terminal member 23 relative to the first portion 21m and is longer in length in the direction perpendicular to the direction of arrangement of the terminal member 23 and the connection conductor 21 than the first portion 21m.

In this case, for example, the connection conductor 21 is engaged with the base body 13 to the terminal member 23 side. As a result, for example, the reliability of fixation of the connection conductor 21 and the base body 13 is improved. Further, for example, the terminal part 17 has a constriction part between the connection conductor 21 and the terminal member 23. Therefore, compared with a case where there is no constriction part, the contact area with the base body 13 and/or resistance heating element 15 increases. As a result, the reliability of fixation of the terminal part 17 and the base body 13 and/or the reliability of conduction between the terminal part 17 and the resistance heating element can be improved.

Further, in the present embodiment, the connection conductor 21 has the recessed portion 22 in the side surface. The terminal member 23 has the projecting portion 24 at the side surface. The recessed portion 22 and the projecting portion 24 are connected.

In this case, for example, compared with a mode where the planes are joined with each other (this aspect is also included in the art according to the present disclosure), the contact area of the connection conductor 21 and the terminal member 23 can be made larger. As a result, the reliability of fixation and/or conduction of the two is improved. Further, the connection conductor 21 and the terminal member 23 are engaged with each other in a direction intersecting the direction of projection of the projecting portion 24. Therefore, from this viewpoint, the reliability of fixation and/or conduction of the two is improved.

Further, in the present embodiment, when viewed on a plane, the area of the connection conductor 21 is smaller than the area of the terminal member 23.

In this case, for example, by making the volume of the terminal part 17 secured in the internal portion of the base body 13 small, heat stress given to the base body 13 can be reduced. In turn, the probability of breakage of the base body 13 can be reduced. On the other hand, the terminal member 23 is made large, thus connection with the wiring member 7 can be facilitated.

Further, in the present embodiment, in the side surface of the terminal member 23, at least a portion of the part other than the part connected to the connection conductor 21 is connected to the resistance heating element 15.

In this case, for example, the terminal member 23 is not only connected through the connection conductor 21 to the resistance heating element 15, but also directly connected to the resistance heating element 15. That is, there are two routes of connection of the resistance heating element 15 and the terminal member 23 (from another viewpoint, wiring member 7). As a result, for example, even if thermal expansion is repeated and one of the two routes is disconnected, the electrical connection is maintained by the other. As a result, the reliability of conduction is improved.

Further, in the present embodiment, in the side surface of the terminal member 23, at least a portion of the part other than the part connected to the connection conductor 21 abuts against the base body 13 or is joined to the base body.

In this case, for example, the terminal member 23 is not only held upon the base body 13 through the connection conductor 21, but also directly held upon the base body 13 without going through the connection conductor 21. That is, the terminal member 23 is held upon the base body 13 by two types of holding methods. As a result, for example, even if thermal expansion is repeated and the hold is released or the strength of hold is lowered in one of the two types of holding methods, the terminal member 23 is held upon the base body 13 by the other holding method.

Further, in the present embodiment, the side surface of the connection conductor 21 and the resistance heating element 15 are connected.

In this case, for example, even if the position in the up/down direction of the connection conductor 21 somewhat deviates from the design value due to machining error, the connection conductor 21 and the resistance heating element 15 are connected. Accordingly, for example, the reliability of the conduction can be improved. From another viewpoint, the machining accuracy can be dropped to reduce the costs.

Further, in the present embodiment, the upper end of the connection conductor 21 is positioned higher than the terminal member 23.

In this case, for example, the volume of the terminal member 23 is increased while an increase of volume of the portion in the terminal part 17, which is positioned on the interior side of the base body 13 can be suppressed. As a result, for example, the probability of breakage of the base body 13 due to a difference of thermal expansion between the base body 13 and the terminal part 17 is reduced. On the other hand, connection between the terminal member 23 and the wiring member 7 is facilitated.

Second Embodiment

FIG. 4A and FIG. 4B are views showing the configuration of a principal part in a heater plate 209 according to a second embodiment and corresponding to FIG. 3A and FIG. 3B for the first embodiment. Further, FIG. 4B is a cross-sectional view taken along the IVb-IVb line in FIG. 4A.

In this embodiment, each terminal part 217 has a plurality of connection conductors 21. Specifically, the terminal part 217 has two connection conductors 21. The positions of the plurality of connection conductors 21 may be suitably set. In the example shown, the two connection conductors 21 are positioned on the two sides (sides opposite to each other) in the direction of extension of the resistance heating element 15 relative to the terminal member 23. From another viewpoint, the two connection conductors 21 are arranged point symmetrically about the terminal member 23 as the symmetrical point. In other words, "n" number of connection conductors 21 are arranged 360°/n rotation symmetrically (here, 180° rotation symmetrically). From another viewpoint, the plurality of connection conductors 21 are arranged in the circumferential direction of the terminal member 23 at equal intervals.

However, even in a case where there are a plurality of connection conductors 21, as explained in the first embodiment, the connection conductors 21 may be positioned in the direction perpendicular with respect to the direction of extension of the resistance heating element 15 relative to the terminal member 23. Further, the two or more connection conductors 21 need not be arranged at point symmetrical or rotation symmetrical positions.

The configurations (shapes, sizes, and materials etc.) of the plurality of connection conductors 21 may be the same as each other (example shown) or may be different from each other. Further, the positions in the vertical direction of the upper surfaces or lower surfaces etc. of the plurality of connection conductors 21 may be the same as each other (example shown) or may be different from each other.

In the explanation of the first embodiment, allusion was made to the fact that each connection conductor 21 could be connected to the resistance heating element 15 at its upper surface, each terminal member 23 could be connected to the resistance heating element 15 at its upper surface, and the upper surfaces of the connection conductor 21 and the terminal member 23 could be made substantially flush with each other. FIG. 4 shows such an example.

In the present embodiment, the plurality of connection conductors 21 which are connected to one resistance heating element surround each terminal member 23 and are connected to the terminal member 23.

In this case, for example, compared with a case where there is one connection conductor 21, various effects explained in the first embodiment are improved. For example, the area of the entirety of the terminal part 217 is made larger relative to the volume of the entirety of the terminal part 217 whereby the effect of improving the reliability of fixation and/or conduction is improved. Further, for example, by increasing the routes of conduction between the resistance heating element 15 and the terminal member 23, the effect of improving the reliability of conduction is improved.

Further, in the present embodiment, the plurality of connection conductors 21 are in a point symmetrical positional relationship when viewed on a plane.

In this case, for example, when the terminal member 23 is torn off from one connection conductor 21, conversely it is expected that the terminal member 23 will be pushed against the other connection conductors 21. That is, the reliability of conduction is improved. Further, for example, it is easy to secure the distance between the two or more connection conductors 21 from each other in the circumferential direction of the terminal member 23, therefore heat stress generated between portions in the base body 13 which are positioned among the plurality of connection conductors 21 and the plurality of connection conductors 21 is reduced.

Further, in the present embodiment, the upper surfaces of the connection conductors 21 and the resistance heating element are connected.

In this case, for example, as in the present embodiment, in a mode where the width of the resistance heating element 15 is larger relative to the thickness of the resistance heating element 15, compared with a case where the side surfaces of the connection conductors 21 and the cross-section of the resistance heating element 15 are connected (FIG. 3B), the connection area between the connection conductors 21 and the resistance heating element is easily secured.

Further, in the present embodiment, the upper surface of the terminal member 23 and the upper surfaces of the connection conductors 21 are flush. For example, the difference in height of the two is less than the thickness of the resistance heating element 15.

In this case, for example, the both of the upper surface of the terminal member 23 and the upper surfaces of the connection conductors 21 can be connected to the resistance heating element 15. As a result, the connection area of the terminal part 217 and the resistance heating element 15 can be made larger.

Third Embodiment

Figure 5:
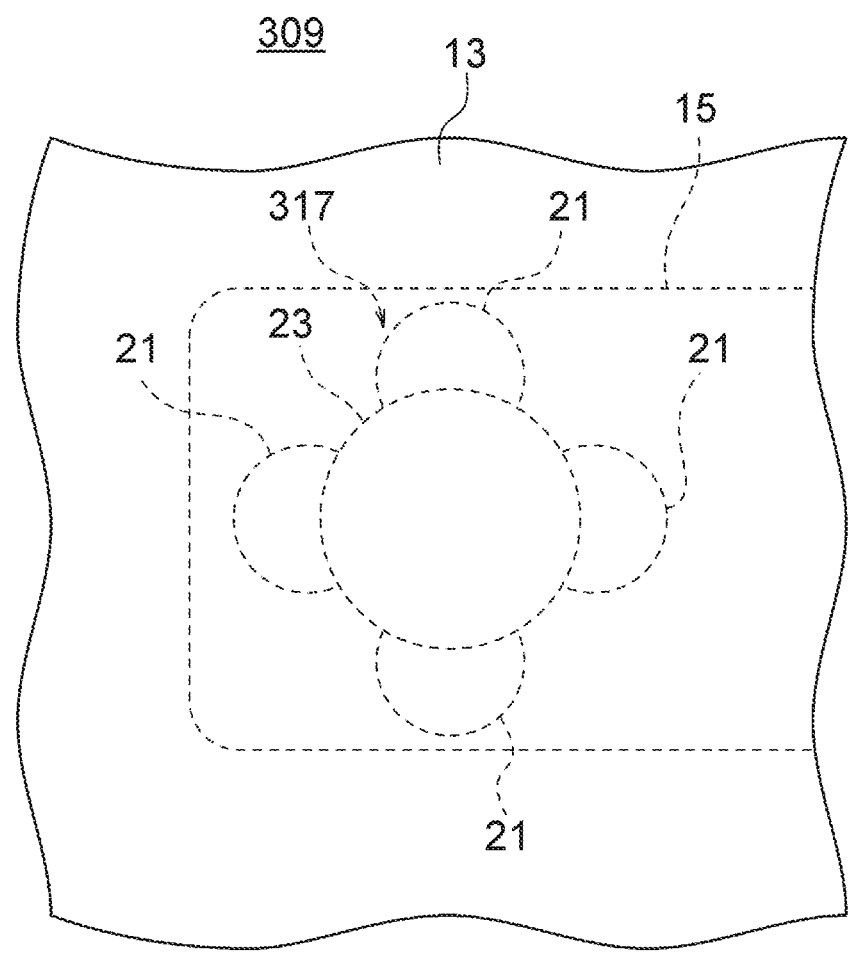
FIG. 5 is a plan view of a terminal part in a heater according to a third embodiment.

FIG. 5 is a view showing the configuration of a principal part of a heater plate 309 according to a third embodiment and corresponding to FIG. 3A for the first embodiment.

In the second embodiment, it was stated that a plurality of connection conductors 21 could be provided. Further, the number of the plurality of connection conductors 21 is not limited to the two illustrated in the second embodiment. It may be three or more. In FIG. 5, four connection conductors 21 are illustrated. More specifically, for example, two among the four connection conductors 21 are arranged in the same way as those in the second embodiment. The remaining two are positioned on the two sides in the width direction of the resistance heating element 15 relative to the terminal member 23. Further, the four connection conductors 21, in the same way as the second embodiment, are arranged 360°/n rotation symmetrically (here, 90° rotation symmetrically) about the terminal member 23 as the symmetrical point.

Fourth Embodiment

Figure 6A:
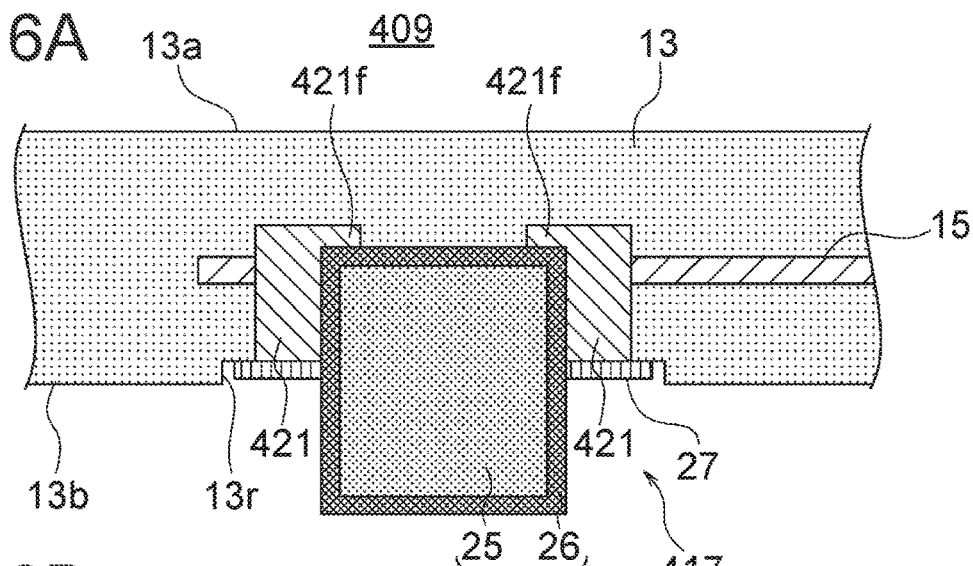
FIG. 6A, FIG. 6B, and FIG. 6C are cross-sectional views of terminal parts in heaters according to a fourth embodiment, a modification, and another modification.

FIG. 6A is a view showing the configuration of a principal part in a heater plate 409 according to a fourth embodiment and corresponding to FIG. 3B for the first embodiment.

In the present and following embodiments, basically, in the same way as the second embodiment, a mode where two connection conductors are provided will be taken as an example. However, in any mode, the number of the connection conductors 21 may be one and may be three or more. Further, in the present and following embodiments, basically, in the same way as the first embodiment, a mode where the side surfaces of the connection conductors and the resistance heating element 15 are connected will be taken as an example. However, except for some modes (modes in which connection of the upper surfaces of the connection conductors and the resistance heating element 15 is not possible), in any of the modes, in the same way as the second embodiment, the upper surfaces of the connection conductors and the resistance heating element may be connected. The terminal members 23 and the resistance heating element 15 may also be connected as in the already explained various modes other than the illustrated mode.

In a terminal part 417 in the fourth embodiment, in the same way as the terminal part 17 shown in FIG. 3B for the first embodiment, the upper surfaces of the connection conductors 421 are positioned higher than the terminal member 23. Further, in the present embodiment, the connection conductors 421 have overlapping portions 421*f* which are superimposed on the upper surface of the terminal member 23 (superimposed on the terminal member 23 when viewed on a plane).

The shapes and dimensions of the overlapping portions 421*f* may be suitably set. For example, in the connection conductors 421, the portions which are positioned on the lower side from the upper surface of the terminal member 23, when viewed on a plane, have the same shapes as the shapes of the connection conductors 21 in the second embodiment. Further, in the connection conductors 421, the portions positioned on the upper side from the upper surface of the terminal member 23, as indicated by a two-dotted chain line in FIG. 4A, when viewed on a plane, have the same shapes (here, circular shapes) as the shape when assuming that the recessed portion 22 was not formed in the connection conductor 21. That is, the overlapping portions 421*f* have the same shapes as the shape of the region cut by the recessed portion 22 in the connection conductor 21.

In this way, if the overlapping portions 421*f* are formed, for example, the contact area of the connection conductors 421 and the terminal member 23 increases. Due to this, for example, the reliability of conduction is improved. Further, for example, the contact area of the connection conductors 421 with the base body 13 increases. Due to this, for example, the reliability of fixation of the connection conductors 421 and the base body 13 is improved.

Note that, as referred to also in the first embodiment, the connection conductors may be connected in their entire circumference with the resistance heating element 15 when viewed on a plane. In the case of the present embodiment, for example, although not particularly shown, by positioning the terminal member 23 and the connection conductors 421 lower than the illustrated positions and the connecting the side surfaces on the terminal member 23 side in the overlapping portions 421*f* with the resistance heating element 15, the entire circumferences of the connection conductors 421 may be connected to the resistance heating element 15. In addition, the upper surface of the terminal member 23 may be connected to the resistance heating element 15.

(Modification of Fourth Embodiment)

Figure 6B:
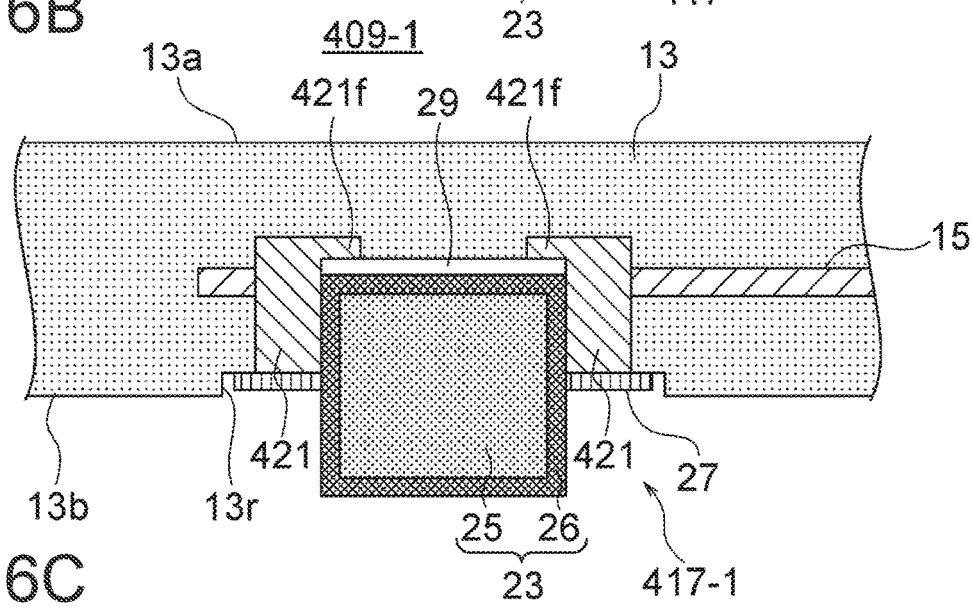

FIG. 6B is a view showing a heater plate 409-1 according to a modification of the fourth embodiment and corresponding to FIG. 6A.

In a terminal part 417-1 in this heater plate 409-1, a space 29 is formed between the upper surface of the terminal member 23 and the base body 13. In the space 29, for example, a gas is present. The gas may be made air, nitrogen, or another suitable one. Alternatively, the space 29 is a vacuum. Note that, the "vacuum" in actuality is a state having a negative pressure by a certain extent of difference relative to the air.

In the example shown, the space 29 extends over the entirety of the upper surface of the terminal member 23 with a constant thickness (distance between the upper surface of the terminal member 23 and the base body 13). However, the thickness of the space 29 may change according to the position in the plane direction. A portion of the upper surface of the terminal member 23 may abut against the base body 13. The thickness of the space 29 may be suitably set. For example, the thickness of the space 29 may be thinner than, equal to, or thicker than the thickness of the resistance heating element 15.

In this way, if the space 29 is configured, for example, when the terminal member 23 undergoes thermal expansion in the vertical direction, the probability of a load being immediately applied from the upper surface of the terminal member 23 to the base body 13 becomes low. As a result, the heat stress between the terminal member 23 and the base body 13 is reduced. Further, the space 29 functions as a heat insulation layer between the terminal member 23 and the base body 13. On the other hand, in the area of the terminal part 417-1, the volume of the conductor having a higher heat conductivity than the base body 13 easily becomes large, therefore the heat in the base body 13 easily rises. Accordingly, for example, by provision of the space 29, transfer of the heat from the conductor to the base body 13 is reduced, thus a reduction of the probability of the temperature at the center of the base body 13 becoming higher than that on the outer circumferential side can be expected.

Note that, the space 29 may be combined with not only the configuration according to the fourth embodiment (for example the connection conductors 421), but also the configuration of the other embodiments (for example the connection conductors 21). Further, when the space 29 is provided, the terminal member 23, for example, need not be connected at its upper surface with the resistance heating element 15 and may be connected at its side surface with the resistance heating element 15 or be connected with the resistance heating element 15 only through the connection conductor 21.

[Other Modification of Fourth Embodiment]

Figure 6C:
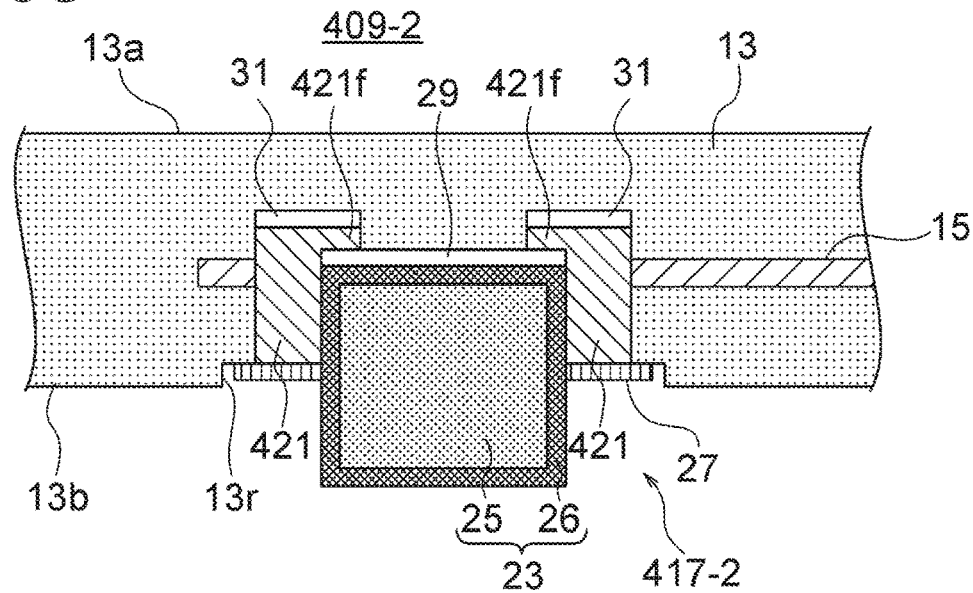

FIG. 6C is a view showing a heater plate 409-2 according to another modification of the fourth embodiment and corresponding to FIG. 6A.

In a terminal part 417-2 in this heater plate 409-2, a space 31 is formed between the upper surface of the connection conductor 421 and the base body 13. In the space 31, in the same way as the space 29, there is gas or it is made a vacuum. The space 31 may be shut off from the space 29 or may be linked with that. When it is shut off, the state in the space 31 (vacuum or not) and/or type of gas or degree of evacuation may be the same as that of the space 29 or may be different from the latter.

In the example shown, the space 31 covers the entirety of the upper surface of the connection conductor 421 with a constant thickness (distance between the upper surface of the connection conductor 421 and the base body 13). However, the thickness of the space 31 may change according to the position in the plane direction. A portion of the upper surface of the connection conductor 421 may abut against the base body 13. The thickness of the space 31 may be suitably set. For example, the thickness of the space 31 may be thinner than, equal to, or thicker than the thickness of the resistance heating element 15 and/or thickness of the space 29.

If the space 31 is configured in this way, for example, the same effects as the effects generated relating to the terminal member 23 are exhibited relating to the connection conductor 421. Specifically, for example, an effect of reduction of the heat stress and/or lowering of the probability of relative rise of the temperature at the center of the base body 13 is obtained.

Note that, the space 31 may be combined with not only the configuration according to the fourth embodiment (for example the connection conductor 421), but also the configuration of the other embodiments (for example the connection conductor 21). Further, when the space 31 is provided, the connection conductor 21, for example, is not connected at its upper surface with the resistance heating element 15, but is connected at its side surface with the resistance heating element 15. In FIG. 6C, both of the space 29 and space 31 are provided. However, although not particularly shown, only the space 31 may be provided.

Fifth Embodiment

FIG. 7A is a view showing the configuration of a principal part in a heater plate 509 according to a fifth embodiment and corresponding to FIG. 3B for the first embodiment.

In the first embodiment, it was stated that the upper surface of the connection conductor 21 may be positioned lower than the upper surface of the terminal member 23 (from another viewpoint, the upper surface of the terminal member 23 may be positioned higher than the connection conductor 21). A terminal part 517 according to the present embodiment is configured as such an example.

In this case, when the upper surface of the terminal member 23 is positioned higher than the connection conductor 21, for example, the terminal member 23 is buried in the base body 13 up to a deep position, therefore the reliability of fixation of the terminal member 23 with respect to the base body 13 is improved. The terminal member 23 is a portion which is connected to the wiring member 7 and to which a load is applied from an external portion. Therefore, the reliability of fixation of the entirety of the terminal part 517 with respect to the base body 13 is also improved. On the other hand, the connection conductor 21 ends up being set away to a lower part from the base body 13, therefore the heat stress caused by the difference of thermal expansion between the terminal part 517 and the base body 13 which is generated at the interior side of the base body 13 can be reduced.

(Modification of Fifth Embodiment)

Figure 7B:
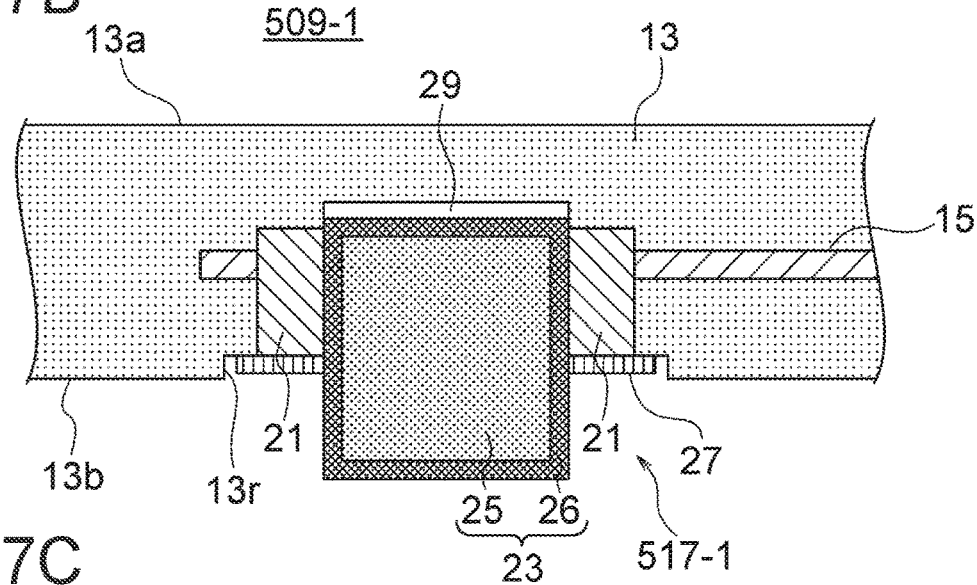

In the explanation of the modification of the fourth embodiment (FIG. 6B), it was stated that the space 29 may be provided in other embodiments. A terminal part 517-1 in a heater plate 509-1 shown in FIG. 7B is configured with the space 29 provided in the terminal part 517 in FIG. 7A.

(Other Modification of Fifth Embodiment)

Figure 7C:
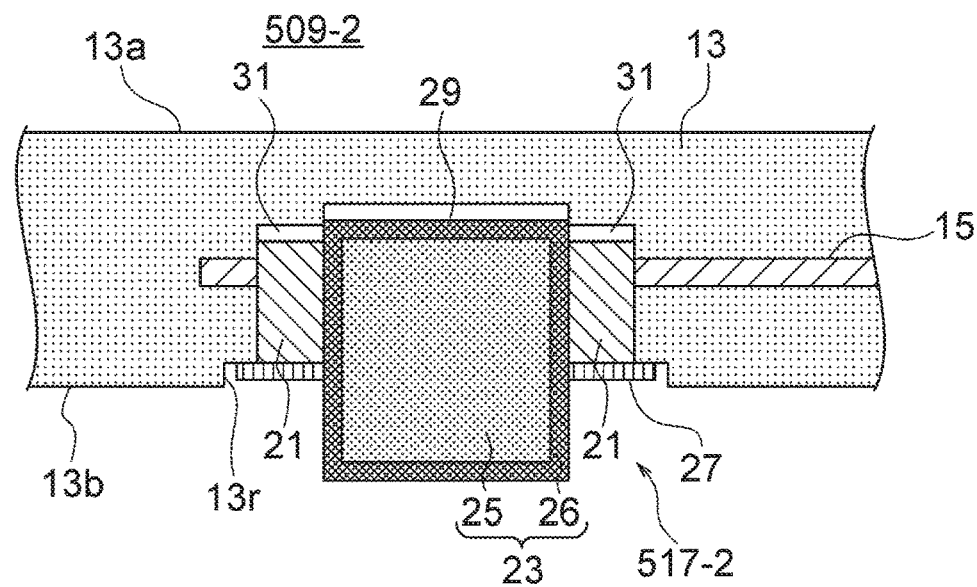

The explanation of the other modification of the fourth embodiment (FIG. 6C) stated that the space 31 may be provided in other embodiments. A terminal part 517-2 in a heater plate 509-2 shown in FIG. 7C is configured with the space 31 provided in the terminal part 517-1 in FIG. 7B.

Sixth Embodiment

Figure 8:
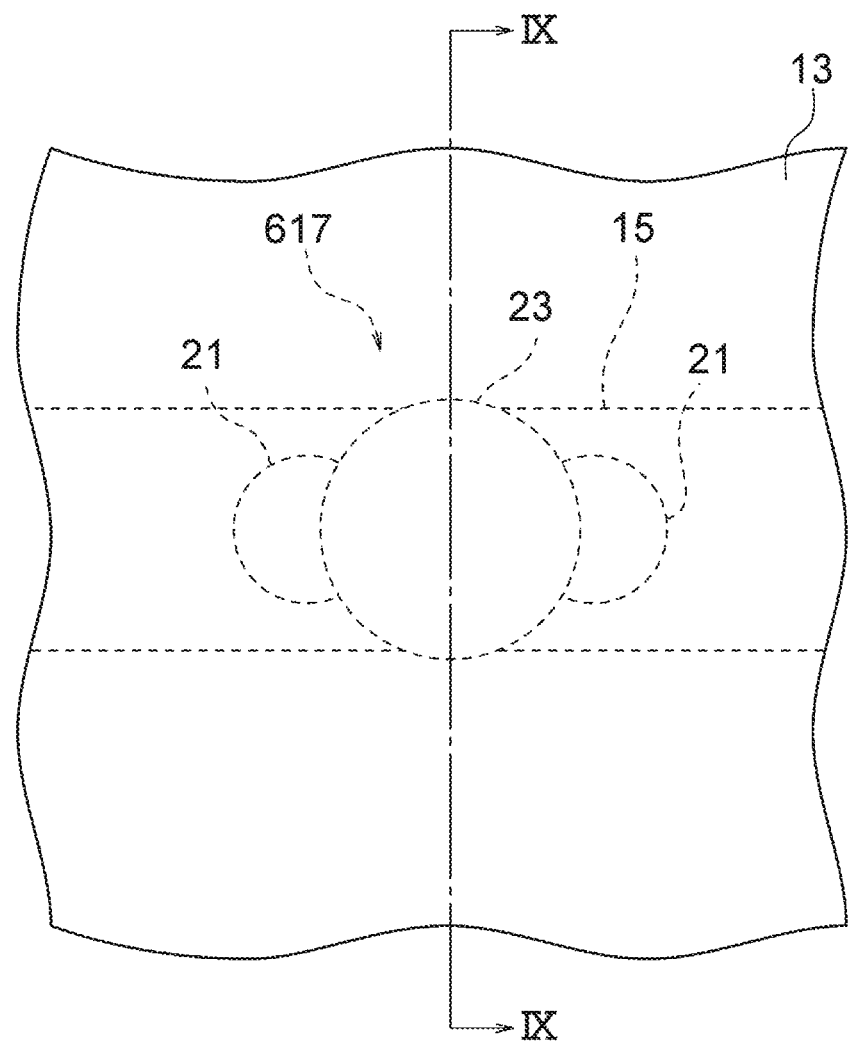
FIG. 8 is a plan view of a terminal part in a heater according to a sixth embodiment.
Figure 9A:
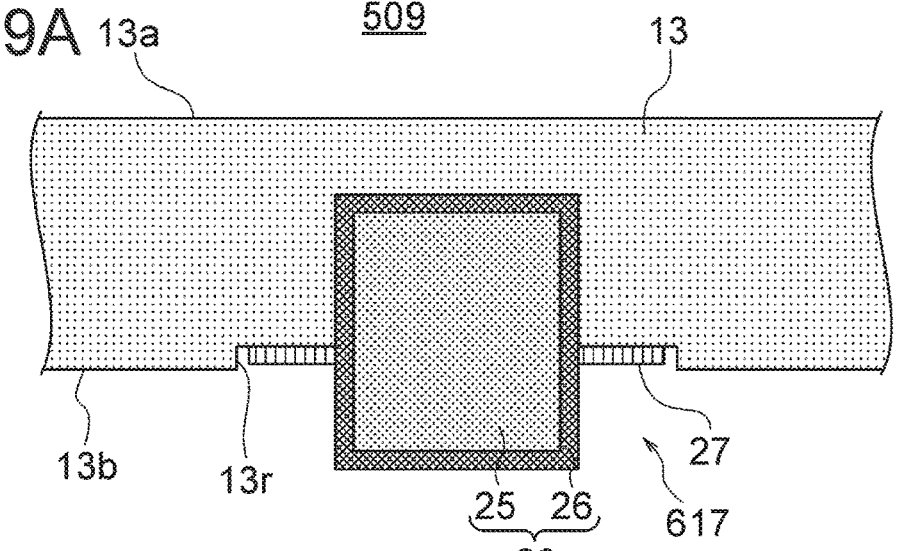
FIG. 9A, FIG. 9B, and FIG. 9C are cross-sectional views of terminal parts in heaters according to a sixth embodiment, a modification, and another modification.

FIG. 8 is a view showing the configuration of a principal part in a heater plate 609 according to a sixth embodiment and corresponding to FIG. 3A for the first embodiment. FIG. 9A is a cross-sectional view corresponding to the IX-IX line in FIG. 8.

In the explanation of the first embodiment, it was stated that the terminal member 23 need not go in its entirety into the resistance heating element 15 in the width direction of the resistance heating element 15. A terminal part 617 according to the present embodiment is configured as such an example. From another viewpoint, in the side surface of the terminal member 23, in the portion which is located at an equal position to the position of the resistance heating element 15 in the vertical direction, at least a portion in a range not connected to the resistance heating element 15 is in contact with the base body 13 (for example joined).

As explained in the explanation of the first embodiment, when at least a portion of the terminal member 23 contacts the base body 13, the reliability of fixation of the terminal member 23 with respect to the base body 13 is improved. In the present embodiment, the reliability of fixation is further improved. Further, the terminal member 23 is relatively large in its diameter, therefore connection with the wiring member 7 is facilitated.

Further, in the explanation of the first embodiment, it was stated that the terminal part could be provided not only in the end part of the resistance heating element 15, but also on a midway position. FIG. 8 shows such an example.

Note that, in the example shown, when viewed on a plane, the terminal member 23 contacts the base body 13 on the two sides in the width direction of the resistance heating element 15. However, it may contact the base body 13 on only one side. Further, the terminal member 23, when viewed on a plane, may contact the base body 13 in a direction other than the width direction of the resistance heating element 15.

(Modification of Sixth Embodiment)

Figure 9B:
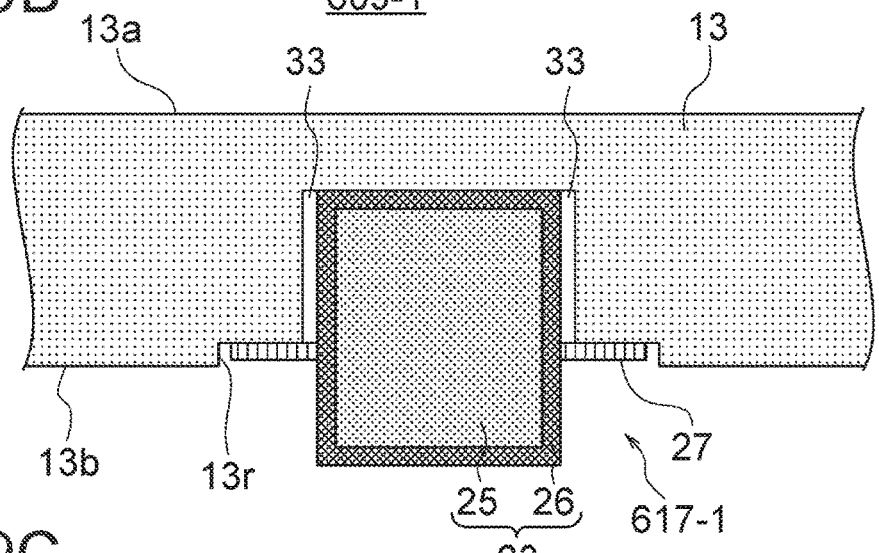

FIG. 9B is a view showing a heater plate 609-1 according to a modification of the sixth embodiment and corresponding to FIG. 9A.

In a terminal part 617-1 in this heater plate 609-1, a space 33 is configured between the side surface of the terminal member 23 and the base body 13. The space 33, in the same way as the spaces 29 and 31 shown in FIG. 6B and FIG. 6C etc., is one containing gas or made a vacuum. In a case where the space 29 and/or 31 is provided, the space 33 may be shut off or linked with respect to the space 29 and/or 31. When it is shut off, the state in the space 31 (vacuum or not) and/or type of gas or degree of vacuum may be the same as that of the space 29 and/or 31 or may be different.

In the example shown, the space 33 extends over the side surface of the terminal member 23 in the entirety of the vertical direction with a constant thickness (distance between the side surface of the terminal member 23 and the base body 13). However, the thickness of the space 33 may change according to the position in the vertical direction. A portion in the side surface of the terminal member 23 may abut against the base body 13. The thickness of the space 33 may be suitably set. For example, the thickness of the space 33 may be thinner than, equal to, or thicker than the thickness of the resistance heating element 15 and/or other space (29 and/or 31).

If the space 33 is configured in this way, for example, when the terminal member 23 undergoes thermal expansion in the plane direction of the plate, the probability of the load being immediately applied from the side surface of the terminal member 23 to the base body 13 falls. As a result, the heat stress between the terminal member 23 and the base body 13 is reduced. Further, the space 33, in the same way as the spaces 29 and 31, functions as a heat insulation layer between the terminal member 23 and the base body 13. As a result, for example, the probability of the temperature at the center of the base body 13 becoming higher than that on the outer circumferential side can be reduced.

Note that, the space 33 may be combined with not only the configuration according to the sixth embodiment, but also the configurations in the other embodiments. For example, even in a mode where the terminal member 23 goes into the resistance heating element 15 when viewed on a plane, the space 33 may be provided between the terminal member 23 and the base body 13. In this case, for example, the terminal member 23 may be connected at its upper surface with the resistance heating element 15 or may be connected with the resistance heating element 15 only through the connection conductor. Further, although not particularly shown, in a mode where the upper surface of the connection conductor 21 and the resistance heating element 15 are connected (see FIG. 4B), the same space as the space 33 may be provided between the side surface of the connection conductor 21 and the side surface of the base body 13.

(Other Modification of Sixth Embodiment)

Figure 9C:
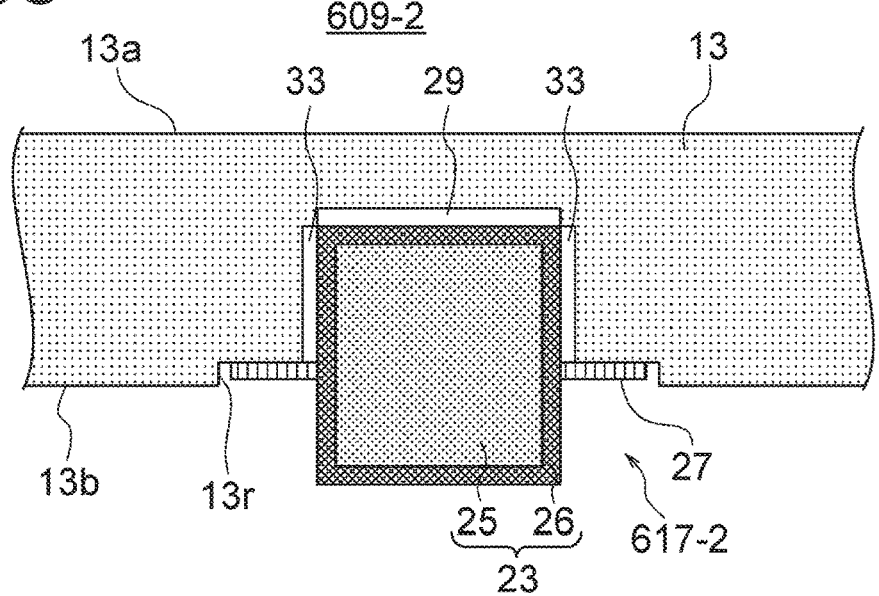

FIG. 9C is a view showing a heater plate 609-2 according to another modification of the sixth embodiment and corresponding to FIG. 9A.

In the explanation of the modification in FIG. 9B, it was stated that the space 29 shown in FIG. 6B etc. may be provided in addition to the space 33. A terminal part 617-2 in the heater plate 609-2 shown in FIG. 9C is configured as such an example.

Seventh Embodiment

Figure 10A:
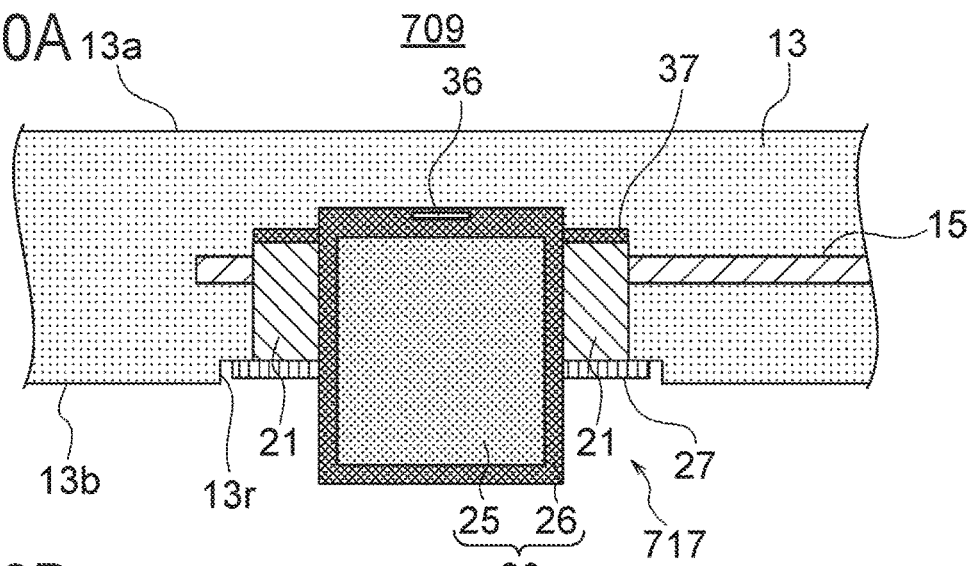
FIG. 10A, FIG. 10B, and FIG. 10C are cross-sectional views of terminal parts in heaters according to a seventh, eighth, and ninth embodiments.

FIG. 10A is a view showing the configuration of a principal part in a heater plate 709 according to a seventh embodiment and corresponding to FIG. 3B for the first embodiment.

A terminal part 717 in the heater plate 709 is configured with a metal layer 37 formed in place of the space 31 shown in FIG. 6C and FIG. 7C. That is, the metal layer 37 is interposed between the upper surface of the connection conductor 21 and the base body 13. The metal layer 37 for example joins the connection conductor 21 and the base body 13. Accordingly, from another viewpoint, the metal layer 37 is a conductive bonding material.

In the explanations of FIG. 6C and FIG. 7C, it was stated that the space 31 may be provided in various modes. In the same way as the space 31, the metal layer 37 may be applied to various embodiments. Further, unlike the case where the space 31 is provided, the upper surface of the connection conductor 21 can be connected with the resistance heating element 15 through the metal layer 37. The metal layer 37 may be connected to the conductor layer 26 in the terminal member 23 or may not be connected.

In the example shown, the metal layer 37 covers the entirety of the upper surface of the connection conductor 21 with a constant thickness. However, the thickness of the metal layer 37 may change in accordance with the position in the plane direction. Further, a portion of the upper surface of the connection conductor 21 may directly contact the base body 13. The thickness of the metal layer 37 may be suitably set. For example, the thickness of this may be thinner than, equal to, or thicker than the thickness of the resistance heating element 15.

The material of the metal layer 37 may be suitably set. For example, the principal ingredient of the material of the metal layer 37 may be different from the principal ingredient of the material of the connection conductor 21. Further, for example, the material of the metal layer 37 may be a material which is the same as or contains the same principal ingredients as the material of the conductor layer 26 (layer in part or whole) or may not be such a material. The material of the metal layer 37 may be made for example a material having a relatively high oxidation resistance. For example, the material of the metal layer 37 may be made a metal having an ionization tendency not more than Ni. As such a metal, there can be mentioned for example Ni, Ag, Pt, and Pd.

Further, in the example in FIG. 10A, the conductor layer 26 in the terminal member 23 has a space 36 on the upper surface side of the terminal base part 25. The space 36, in the same way as the space 29 etc., is one containing gas or made a vacuum. The space 36 may be surrounded in its entirety by the conductor layer 26 or a portion may contact the terminal base part 25 and/or base body 13. Further, in the explanation of the first embodiment, it was stated that the conductor layer 26 may be configured from two or more conductor layers made of materials different from each other. The space 36 may be positioned between these layers. The size and shape of the space 36 may be suitably set.

As explained above, in the present embodiment, the metal layer 37 is provided between the upper surface of the connection conductor 21 and the base body 13. In this case, for example, the bonding strength between the connection conductor 21 and the base body 13 can be improved.

Further, in the present embodiment, the conductor layer 26 in the terminal member 23 includes the space 36. In this case, for example, the conductor layer 26 is easily deformed compared with a case where there is no space 36. As a result, for example, the heat stress generated between the terminal member 23 and the base body 13 can be eased.

Eighth Embodiment

Figure 10B:
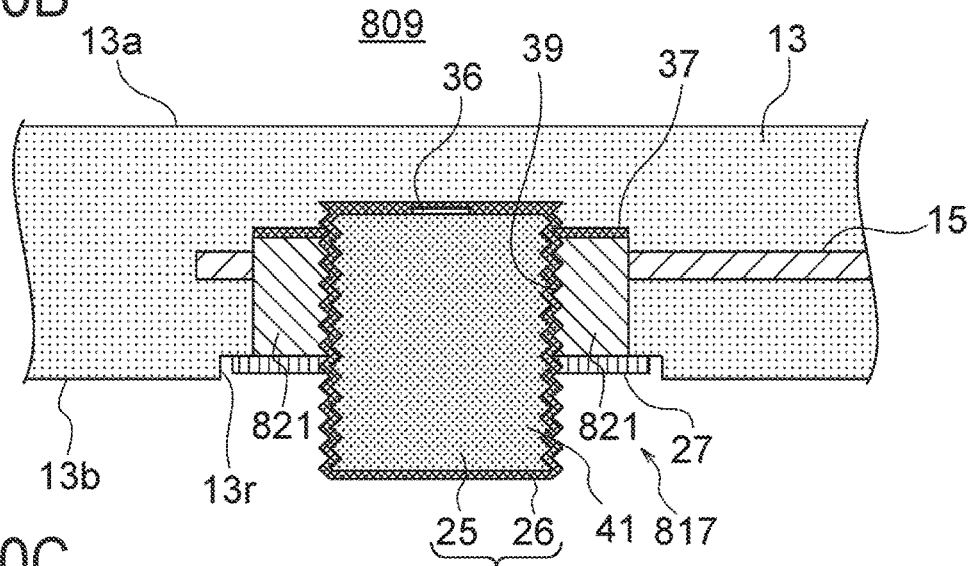

FIG. 10B is a view showing the configuration of a principal part in a heater plate 809 according to an eighth embodiment and corresponding to FIG. 3B for the first embodiment.

A terminal part 817 in the heater plate 809 is configured with a connection conductor 821 and a terminal member 823 screwed together. That is, the connection conductor 821 configures a female screw 39, and the terminal member 823 configures a male screw 41. Note that, the example shown is configured so that the female screw 39 and the male screw 41 are provided in the configuration shown in FIG. 10A. However, the female screw 39 and the male screw 41 may be applied to any other configuration (for example a configuration not having the metal layer 37).

As understood from FIG. 4A, the female screw 39 is for example configured by the recessed portion 22 (notation is omitted in FIG. 10B) in the connection conductor 821 and the inner surface of the hole in the base body 13 through which the terminal member 23 is inserted. Further, a portion of the male screw 41 is configured by the projecting portion 24 (notation is omitted in FIG. 10B) of the terminal member 823. The pitch etc. of the female screw 39 and the male screw 41 may be suitably set. Note that, although not particularly shown, in a case where the lower surface of the connection conductor 821 is positioned higher than the lower surface 13b of the base body 13, the female screw 39 may also be positioned in a portion in the base body 13 which is lower than the connection conductor 821.

The thread groove of the male screw 41 is for example configured by a thread groove cut at the side surface of the terminal base part 25 covered by a conductor layer 26 which is thinner than the depth of this thread groove and has substantially a constant thickness. However, for example, it is also possible to form a relatively thick conductor layer 26 on the surface of the terminal base part 25 at which a thread groove is not cut and cut a thread groove only at the conductor layer 26.

Although not particularly shown, between the female screw 39 and the male screw 41, a conductive bonding material may be arranged. The bonding material may be grasped as part or all of the conductor layer 26 in the terminal member 823 in the terminal part 817 after completion. From another viewpoint, the surface of the male screw 41 (surface of the conductor layer 26) may be adhered with substantially the entirety of the surface of the female screw 39 (case where the bonding material is arranged and the bonding material is regarded as a portion of the conductor layer 26) or may abut against a portion of the surface of the female screw 39 (case where the bonding material is not arranged or not regarded as the conductor layer 26 even if the bonding material is arranged). The material of the bonding material may be made for example metal having a relatively high oxidation resistance. As such a metal, for example, as already explained, use may be made of a metal having an ionization tendency not more than Ni (for example Ni, Ag, Pt, and Pd).

As explained above, in the present embodiment, the recessed portion 22 in the connection conductor 821 configures the female screw 39, and the projecting portion 24 of the terminal member 823 configures the male screw 41 screwed with the female screw 39. In this case, for example, the strength of fixation of the terminal member 823 and the connection conductor 821 can be improved.

Ninth Embodiment

Figure 10C:
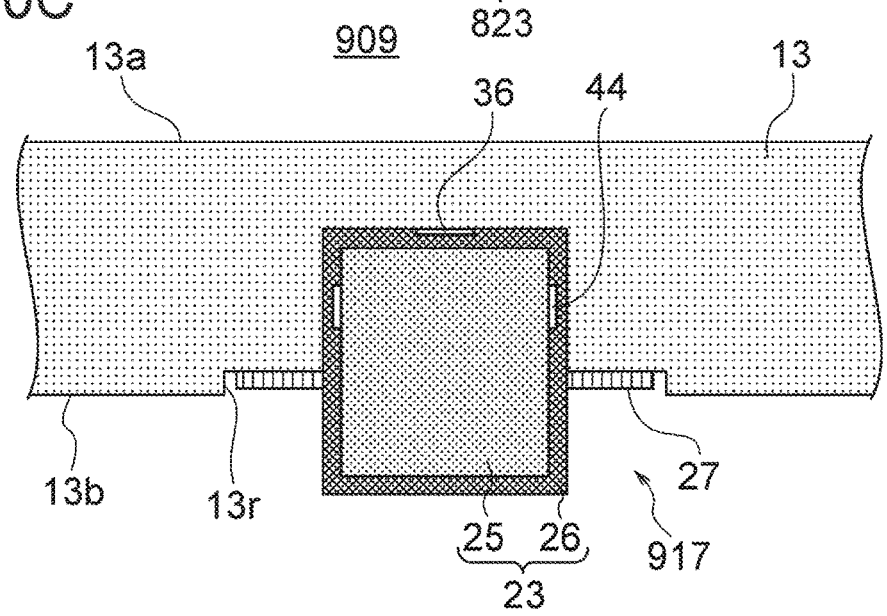

FIG. 10C is a view showing the configuration of a principal part in a heater plate 909 according to a ninth embodiment and corresponding to FIG. 3B for the first embodiment.

In FIG. 10A, it was stated that the conductor layer 26 in the terminal member 23 may have the space 36 on the upper surface side of the terminal base part 25. In a terminal part 917 in FIG. 10C, the conductor layer 26 has a space 44 at the side surface of the terminal base part 25. The space 44 may be made the same as the space 36 except that its position is different from that of the space 36. The explanation of the configuration and effect for the space 36 may be employed for the explanation of the space 44.

Note that, here, a case where the space 44 is applied to the mode in FIG. 9A is illustrated. However, the space 44 may be applied to the other various modes. For example, the space 44 may be provided in a mode where the conductor layer 26 and the resistance heating element 15 are directly connected. Further, although not particularly shown, the conductor layer 26 may have a space in the portion positioned on a lower side of the terminal base part 25.

[Modifications of Seventh and Eighth Embodiments]

Figure 11A:
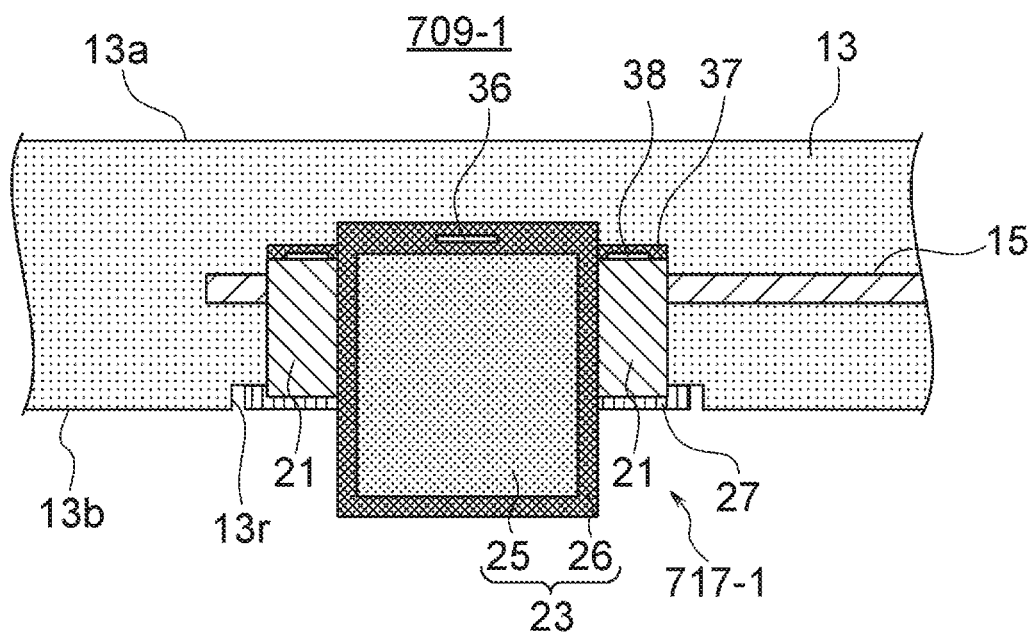
FIG. 11A and FIG. 11B are cross-sectional views of terminal parts in heaters according to a modification and another modification.
Figure 11B:
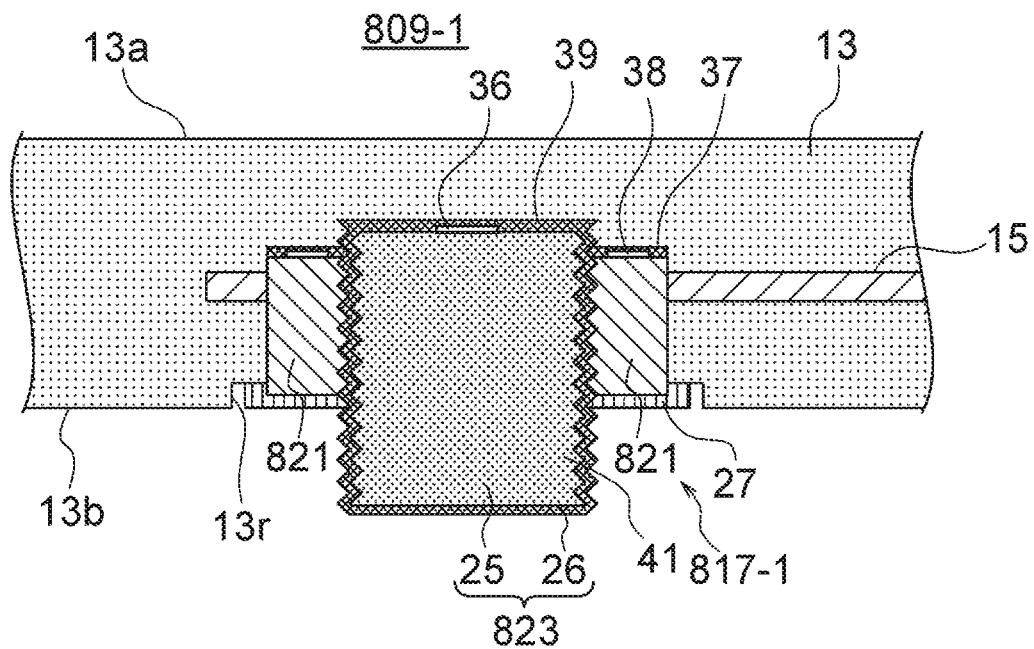

FIG. 11A is a view showing the configuration of a heater plate 709-1 according to a modification of the seventh embodiment shown in FIG. 10A and corresponding to FIG. 10A. FIG. 11B is a view showing the configuration of a heater plate 809-1 according to a modification of the eighth embodiment shown in FIG. 10B and corresponding to FIG. 10B.

In the explanation of the first embodiment, it was stated that the lower surface of the connection conductor 21 may be positioned lower than the lower surface 13b of the base body 13 (in more detail, the bottom surface of the later explained recessed portion 13r). The terminal parts 717-1 and 817-1 shown in FIG. 11A and FIG. 11B are configured as such examples. In other words, the connection conductors 21 and 821 have projecting portions projecting to lower parts than the lower surface 13b. Note that, such a configuration where the connection conductor projects to a lower part than the lower surface 13b of the base body 13 is not limited to the seventh and eighth embodiments and may be applied to the other various modes.

The amounts of projections of the connection conductors 21 and 821 from the lower surface 13b and the like may be suitably set. For example, the amounts of projection may be smaller than, equal to, or larger than the thickness of the resistance heating element 15. Further, the amounts of projections are set to not more than the depth of the recessed portion 13r. Naturally, in a mode where no recessed portion 13r is provided, the configuration of the connection conductor projecting from the lower surface 13b may be employed. Further, the amount of projection may be made larger than the depth of the recessed portion 13r.

Further, in the terminal parts 717-1 and 817-1, the metal layers 37 have the spaces 38. The space 38, in the same way as the space 36 etc. is made one containing gas or which is evacuated. The space 38 may be surrounded in its entirety by the metal layer 37 or a portion may contact the connection conductor 21 and/or base body 13. The size and shape of the space 38 may be suitably set.

As explained above, in the present embodiment, the connection conductors 21 and 821 project downward from the lower surfaces 13b of the base bodies 13. In this case, for example, by extending the connection area between the connection conductor and the terminal member 23 to a lower part, the reliability of bonding and/or conduction of the two can be improved. On the other hand, the above extended portion is positioned outside the base body 13. Therefore, even if thermal expansion occurs, basically it does not impart a load to the base body 13. Accordingly, an increase of the connection area of the connection conductor with the terminal member 23 and a reduction of the heat stress generated between the connection conductor and the base body 13 can be both achieved.

Further, in the present embodiment, the metal layer 37 includes the space 38. In this case, for example, the metal layer 37 is easily deformed compared with the case where there is no space 38. As a result, for example, the bonding strength between the connection conductor 21 and the base body 13 is raised, while the heat stress generated between the connection conductor and the base body 13 can be eased.

10th Embodiment

Figure 12:
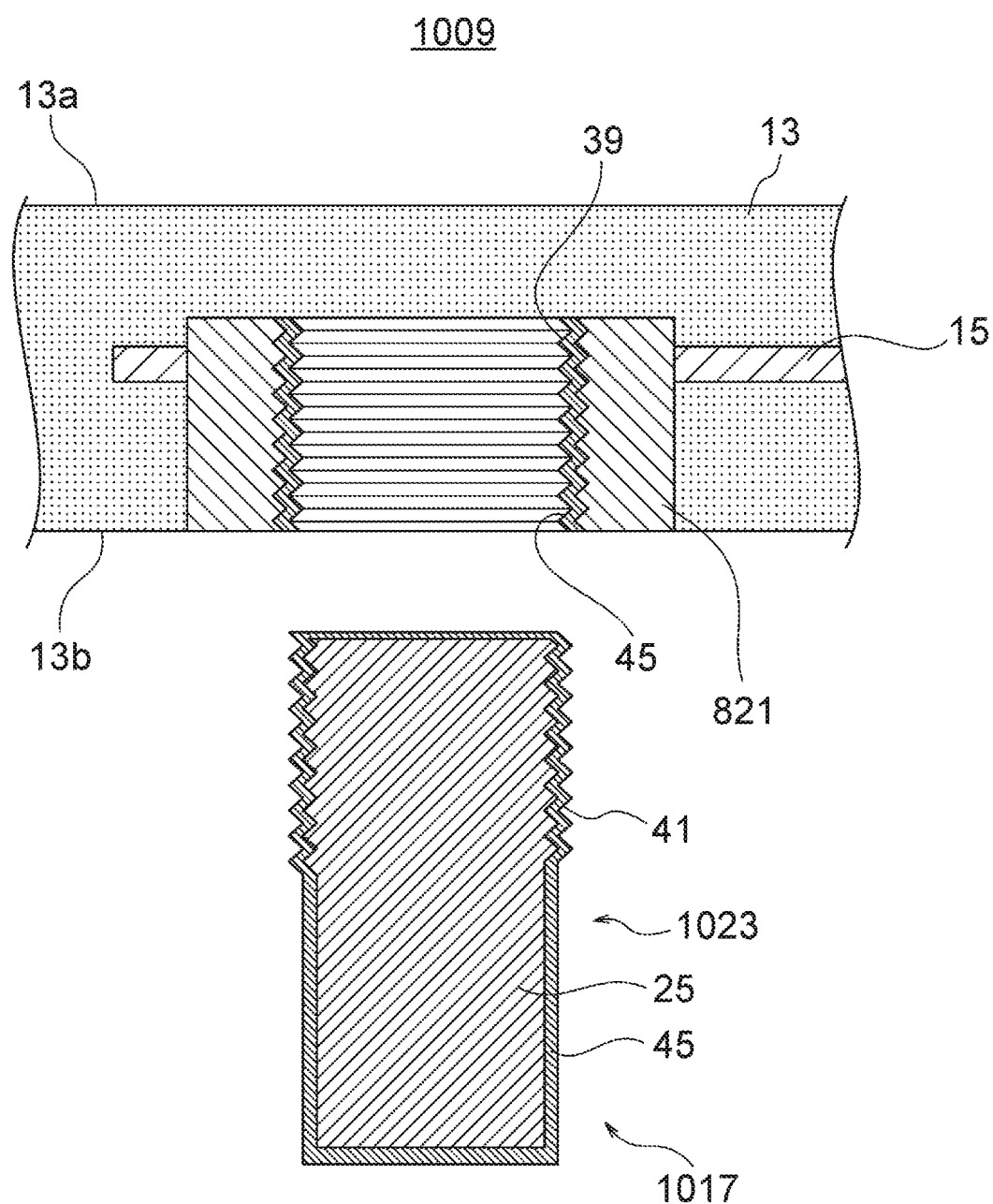
FIG. 12 is a cross-sectional view of a terminal part in a heater according to a 10th embodiment.

FIG. 12 is a view showing the configuration of a principal part in a heater plate 1009 according to a 10th embodiment and corresponding to FIG. 3B for the first embodiment.

In the explanation of FIG. 10B, it was stated that a bonding material may be arranged between the female screw 39 and the male screw 41 and the bonding material may form part or all of the conductor layer 26 in the terminal member 823 in the terminal part 817 after completion. A terminal part 1017 shown in FIG. 12 has a terminal member 1023 in which the entirety of the conductor layer 26 is configured by a bonding material 45.

Specifically, for example, the bonding material 45 is coated on both of the female screw 39 in the connection conductor 821 and the male screw 41 on the terminal base part 25. Further, after screwing together the female screw 39 and the male screw 41, the bonding materials 45 of the two are fixed by heat treatment (heating), and the conductor layer 26 (here, notation is omitted) is configured by the bonding materials 45.

The materials of such bonding materials 45 may be made suitable ones. For example, they may be made the material of the already explained conductor layer 26. Further, for example, they may be brazing materials containing Ag—Cu—Ti alloy (alloy containing Ag, Cu, and Ti). In such an alloy, for example, Ag and Cu are the principal ingredients. The "Ag and Cu are the principal ingredients" means for example that the sum of Ag and Cu is 50 mass % or more or 80 mass % or more in 100 mass % of all of the ingredients configuring the bonding material 45 (conductor layer 26). When explaining one example of the ratio of ingredients, Ag is 60 mass % to 80 mass, Ti is 1 mass % to 2 mass, and the remainder is Cu.

As explained above, in the present embodiment, the conductor layer 26 includes an alloy containing Ag, Cu, and Ti. In the alloy, Ag and Cu are the principal ingredients. In this case, for example, the conductor layer 26 contributes to bonding of the insulating terminal base part 25 and the connection conductor 821 and is made of one type of material. Accordingly, for example, the configuration is simple, therefore the costs are reduced.

(Modifications of Connection Conductor)

Figure 14A:
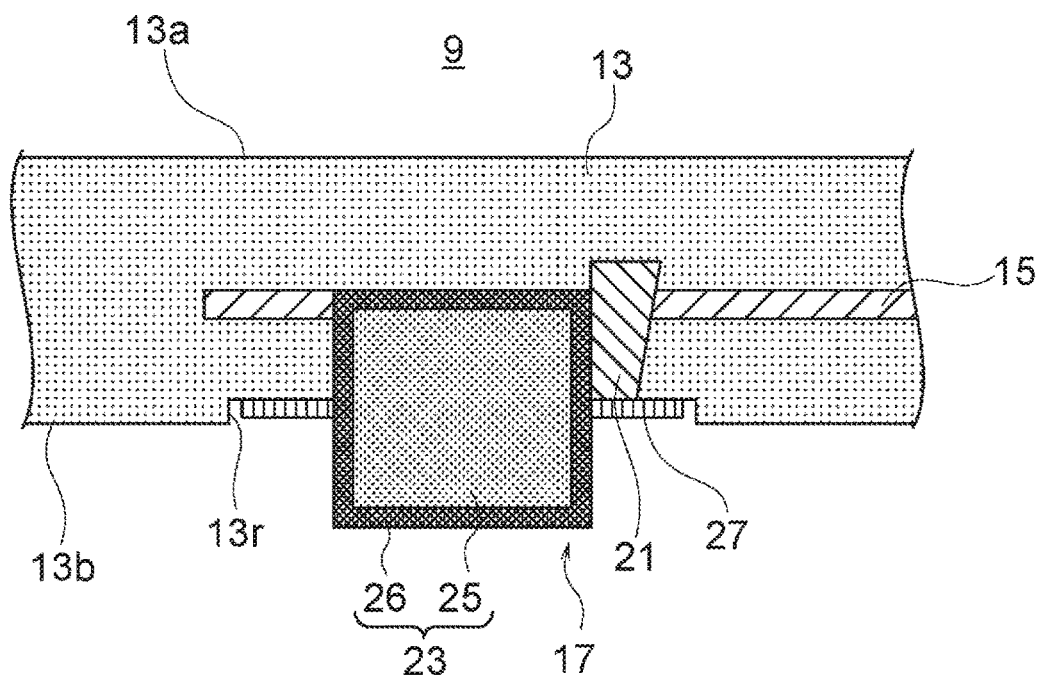
FIG. 14A and FIG. 14B are cross-sectional views showing a modification and another modification of a connection conductor.
Figure 14B:
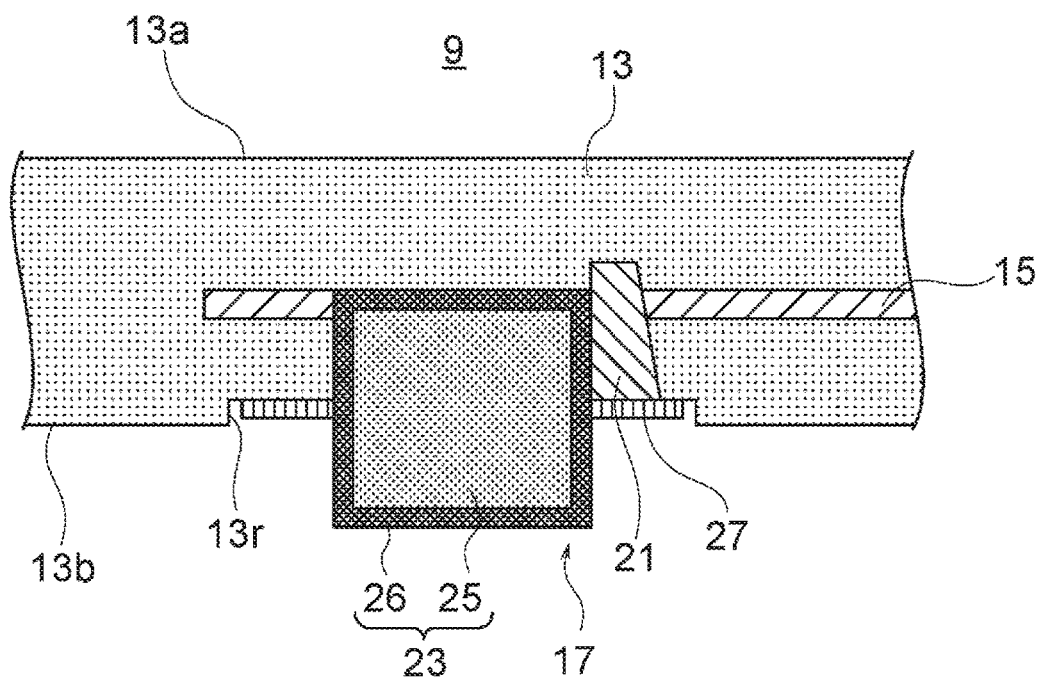

FIG. 14A and FIG. 14B are cross-sectional views showing a modification and another modification of the connection conductor. These views are the same as FIG. 3B.

In the explanation of the first embodiment, it was stated that the shape and size of the transverse cross-section in the connection conductor 21 parallel to the base body 13 (in more detail, for example, the upper surface 13a) may be constant in the thickness direction (vertical direction) of the base body 13 or may not be constant (may differ according to the position in the vertical direction). FIG. 14A and FIG. 14B show one example and another example in the latter case.

Specifically, in the example in FIG. 14A, the connection conductor 21 is tapered so that the area of the transverse cross-section becomes larger toward the upper surface 13a side. In the example in FIG. 14B, the connection conductor 21 is tapered so that the area of the transverse cross-section becomes smaller toward the upper surface 13a side. Note that, here, the configuration of the first embodiment is taken as an example, and use is made of notations in the first embodiment. However, the shapes relating to the modifications may be applied to the other embodiments (second to 10th embodiments).

According to the configurations according to the modifications as explained above, for example, the heat stress in the direction parallel to the upper surface 13a can be released to the up/down direction. As a result, for example, the probability of occurrence of cracks in the base body 13 can be reduced. Further, for example, it is made easy to restrict movement of the connection conductor 21 in the vertical direction relative to the base body 13. As a result, for example, the probability of occurrence of poor contact between the connection conductor 21 and the resistance heating element 15 can be reduced.

Figure 15A:
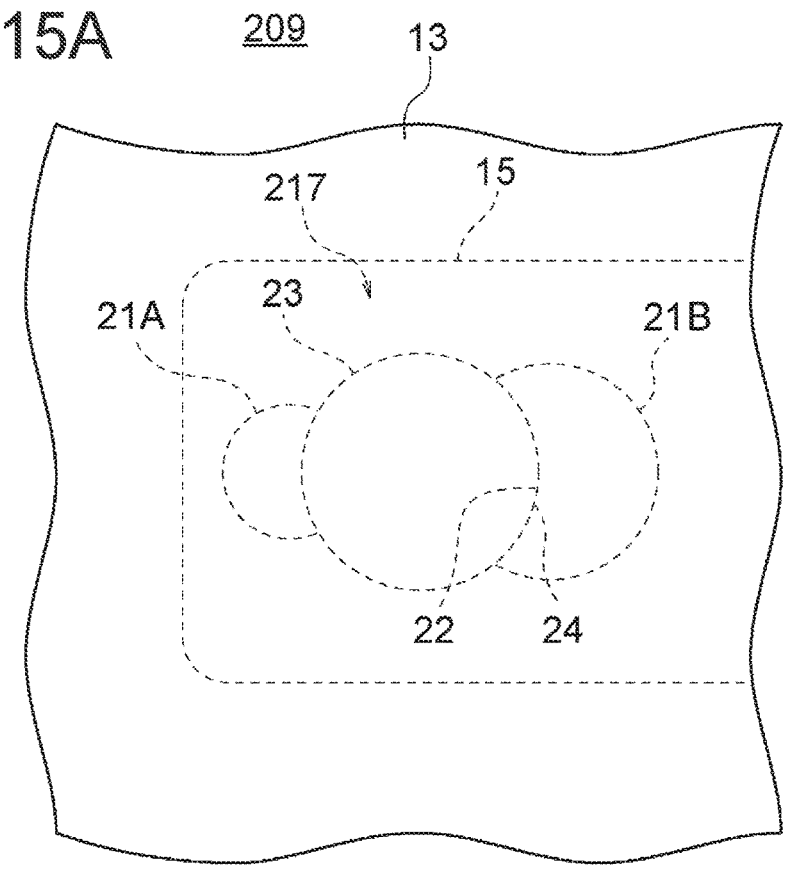
FIG. 15A is a plan view showing still another modification of the connection conductor.

FIG. 15A is a plan view showing still another modification of the connection conductor and is the same as FIG. 4A.

As explained in the explanation of the second embodiment, the configurations (shapes, sizes, materials, etc.) of the plurality of connection conductors 21 may be the same as each other or may be different from each other. FIG. 15A shows one example in the latter case. Note that, here, the configuration in the second embodiment is taken as an example, and use is made of notations in the second embodiment. However, the shapes according to the modification may be applied to the other embodiments (third to 10th embodiments).

In the example shown, a connection conductor 21B on the right side on the drawing sheet becomes larger in cross-sectional area parallel to the upper surface 13a of the base body 13 than a connection conductor 21A on the left side on the drawing sheet. Alternatively or simultaneously, the connection area of the connection conductor 21B with respect to the terminal member 23 (from another viewpoint, the length of the arc of the recessed portion 22) becomes larger than the connection area of the connection conductor 21A with respect to the terminal member 23. Although not particularly shown, the two connection conductors 21 may be the same in radius as each other and be different from each other in the distance between the center of the circle of the connection conductor 21 and the center of the circle of the terminal member 23 and thereby may be different from each other in the cross-sectional area and/or connection area.

In this way, in a case where the plurality of connection conductors 21 include two or more connection conductors 21 between which at least either of the cross-sectional areas when viewed on a plane or the connection areas with respect to the terminal member 23 are different from each other, for example, the degree of freedom of the configuration of the terminal part 217 is improved. As a result, for example, in a direction in which an increase of size of a connection conductor 21 is difficult due to the position relationship with another conductor having a different potential, the connection conductor 21 is made small while the other connection conductor 21 is made large, whereby the reliability of connection of the connection conductors 21 and the terminal member 23 can be improved.

(Modification of Terminal Member)

Figure 15B:
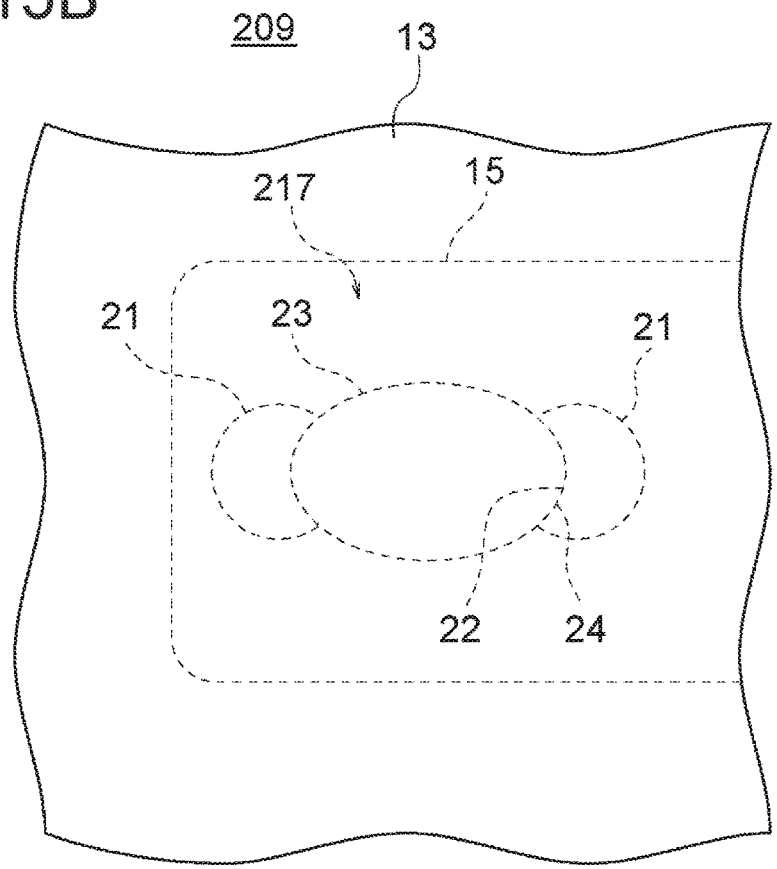
FIG. 15B is a plan view showing a modification of the terminal member.

FIG. 15B is a plan view showing a modification of the terminal member 23, and is similar to FIG. 4A.

As explained in the explanation of the first embodiment, the shape of the transverse cross-section of the terminal member 23 parallel to the base body 13 may be made a circular shape or polygonal shape or another suitable shape. FIG. 15B shows an example of an elliptical shape. Here, the configuration of the second embodiment is taken as an example, and use is made of notations in the second embodiment. However, the shape according to the modification may be applied to the other embodiments (third to 10th embodiments).

The ellipse is not limited to one defined in mathematics. For example, the ellipse may be any of shapes from shapes configured by outward projecting curves except for circular shapes or may be a shape formed by making the short sides of a square expand outward. Further, the flattening of the ellipse may be suitably set.

In this way, in a case where the terminal member 23 is an ellipse (from another viewpoint, noncircular), for example, in the manufacturing process of the heater or at the time of use, the probability of rotation of the terminal member 23 relative to the base body 13 is reduced. As a result, for example, the probability of occurrence of poor contact between the terminal member 23 and the connection conductor 21 is reduced.

(Manufacturing Method of Heater)

FIG. 13A to FIG. 13D are cross-sectional views showing one example of the method for manufacturing the heater plate and corresponds to FIG. 3A for the first embodiment (however, inverted in the up/down directions). Here, as the configuration of the terminal part, the one shown in FIG. 7A is taken as an example. However, the same manufacturing method may be applied also for the other terminal parts. The manufacturing method proceeds in order from FIG. 13A to FIG. 13D. The materials and shapes etc. of the members change along with progress in the manufacturing process. However, for convenience of explanation, the same notations are used before and after the change of the material, shape, or the like.

Figure 13A:
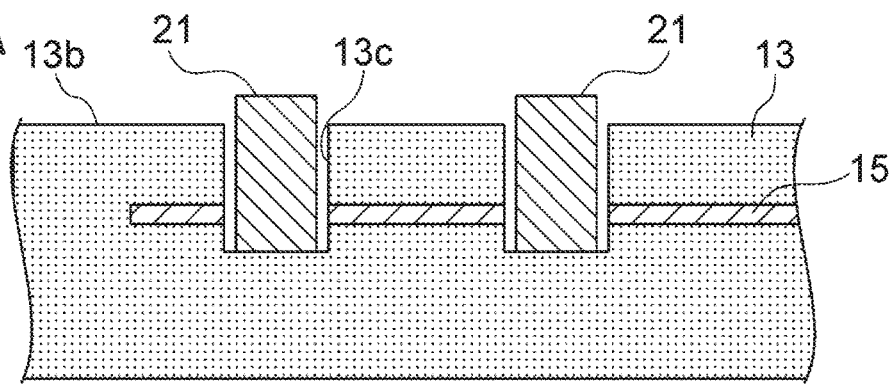
FIG. 13A, FIG. 13B, FIG. 13C, and FIG. 13D are cross-sectional views for explaining a method for manufacturing the heater according to the embodiment.

As shown in FIG. 13A, a base body 13 (green base body 13) made of a ceramic material before firing is prepared. In the internal portion of the green base body 13, for example, a resistance heating element 15 made of a conductive paste before firing (green resistance heating element 15) is buried. Such a green heater plate may be prepared by various conventionally known methods. For example, it may be prepared by stacking ceramic green sheets on which the conductive paste is arranged.

In the lower surface 13b of the green base body 13, recessed portions 13c in which connection conductors 21 are to be arranged are formed. The recessed portions 13c may be formed either before stacking and after stacking of the ceramic green sheets. In the recessed portions 13c, connection conductors 21 made of metal (bulk material) are arranged. The diameters of the recessed portions 13c are set so as to become somewhat larger than the diameters of the connection conductors 21.

Figure 13B:
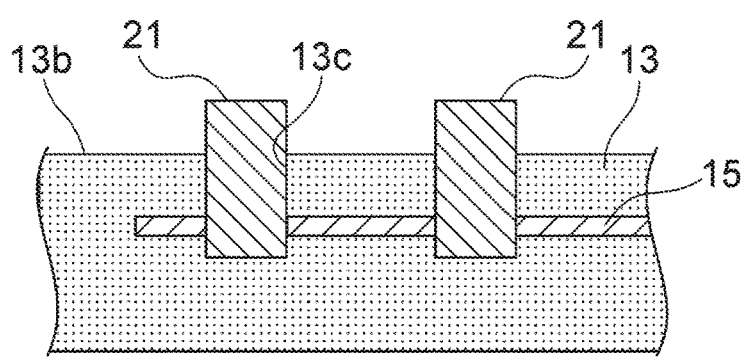

Next, as shown in FIG. 13B, the green base body 13 is fired. By firing, the base body 13 contracts and fastens the connection conductors 21. In addition, the resistance heating element 15 and the connection conductors 21 are joined.

Figure 13C:
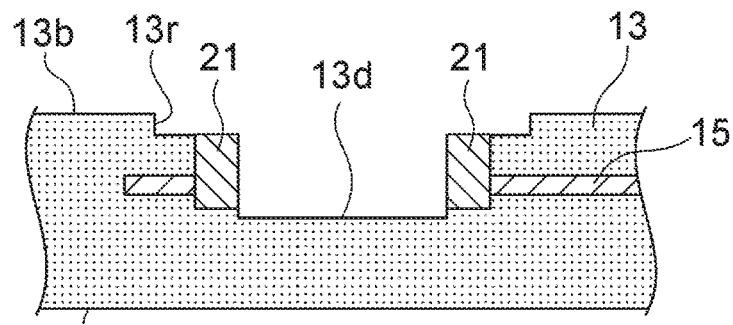
Figure 13D:
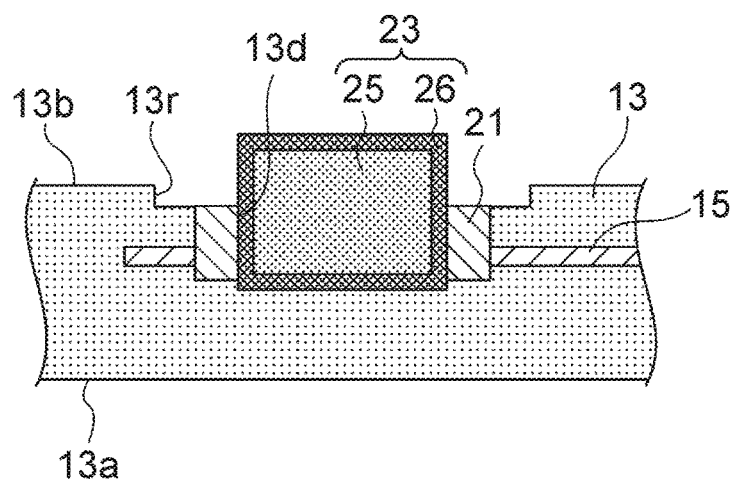

Next, as shown in FIG. 13C, the recessed portion 13r and recessed portion 13d are formed by cutting or the like. The recessed portion 13d, as will be understood from the later explained FIG. 13D, are one in which the terminal member 23 is to be arranged. Either of the recessed portion 13r and recessed portion 13d may be formed previously.

After that, the terminal member 23 is arranged in the recessed portion 13d and connected to the connection conductors 21. The connection may be carried out by a suitable method. For example, it may be carried out by a brazing material and/or screwing. Conductor layer 26 may be formed in part or whole on the terminal base part 25 before the terminal member 23 is arranged in the recessed portion 13d or may be formed in part or whole after the terminal member 23 is arranged in the recessed portion 13d. Further, in a case where part or all of the conductor layer 26 is formed before the terminal member 23 is arranged in the recessed portion 13d, the conductor layer 26 may go through the processes of melting and solidification in the process of connecting the terminal member 23 and the connection conductors 21.

According to need, a clearance between the terminal member 23 and the base body 13 may be filled with an insulating base body by a known method. Further, a not shown glass or other sealing material 27 may be arranged in the recessed portion 13r according to need.

The method for manufacturing the terminal member 23 may be made a suitable one. For example, the terminal member 23 may be prepared by coating a conductive paste forming the conductor layer 26 on ceramic molded body before firing which form the terminal base part 25 and simultaneously firing the two. Further, the conductor layer 26 may be formed in a film with respect to the terminal base part 25 after firing according to a conventionally known thin film forming method such as vapor deposition process.

As will be understood from FIG. 13A and FIG. 13B, the connection positions (upper surfaces or side surfaces) of the connection conductors 21 with respect to the resistance heating element 15 can be set by the depths of the recessed portions 13c. As will be understood from FIG. 13C and FIG. 13D, the connection position (upper surface or side surface) of the terminal member 23 with respect to the resistance heating element 15 can be set by the depth of the recessed portion 13d. Further, from another viewpoint, the relative positional relationships between the upper surfaces of the connection conductors 21 and the upper surface of the terminal member 23 can be prescribed by the relative depths of the recessed portions 13c and recessed portion 13d.

In the formation of the recessed portion 13d in FIG. 13C, not only is the base body 13 machined (for example cut), but also the connection conductors 21 are machined. Due to this, as shown in FIG. 3A etc., the recessed portions 22 in the connection conductors 21 are formed. Further, when forming the recessed portions 22 in the connection conductors 21 in this way, if the depth of the recessed portion 13d is made shallower than the embedded depths of the connection conductors 21, the connection conductors 421 shown in FIG. 6A are formed. The configuration shown in FIG. 3B in which the connection conductor 21 having the recessed portion 22 from the upper end up to the lower end is closer to the upper surface 13a than the terminal member 23 can be for example realized by arranging the connection conductor 21 having the recessed portion 22 in the process in FIG. 13A, then making the depth of the recessed portion 13d shallower than the embedded depth of the connection conductor 21 in FIG. 13C.

The configuration shown in FIG. 11A etc. in which the connection conductors 21 project from the bottom surface of the recessed portion 13r in the base body 13 may be for example realized in the machining for forming the recessed portion 13r since the base body 13 is more easily machined than the connection conductors 21. The spaces 33 shown in FIG. 9C may be for example realized in the machining for forming the recessed portion 13d since the base body 13 is more easily machined than the connection conductors 21 (in the inner surface of the recessed portion 13d, the connection conductors 21 project out from the base body 13).

The spaces 31 shown in FIG. 6C or the like may be for example formed by contraction along with the firing of the portions of the base body 13 which are closer to the upper surface 13a than the connection conductors 21. Further, the spaces 31 may be for example formed by making the diameters of at least parts of the recessed portions 13c in the green base body 13 the same extent as the diameters of the connection conductors 21 and firing the base body 13 in a state where the connection conductors 21 are made rise up from the bottom surfaces of the recessed portions 13c. Further, the space 29 shown in FIG. 6C or the like may be formed by fixing the terminal member 23 and the connection conductors 21 etc. so that the spaces 29 are formed when fixing the two.

The metal layers 37 shown in FIG. 10A or the like may be for example arranged on the outer surfaces of the connection conductors 21 and/or inner surfaces of the recessed portions 13c when arranging the connection conductors 21 in the recessed portions 13c. The spaces 36, 38, and 44 in the conductor layers 26 and metal layers 37 may be formed along with hardening and shrinkage of the metal and/or dissipation of a solvent or may be formed by arranging the material forming the metal layers so that bubbles are mixed in.

The female screw 39 shown in FIG. 10B or the like may be formed after the process in FIG. 13C by cutting the thread groove in the inner surface of the recessed portion 13d by a conventionally known method. The male screw 41, as referred to in the explanations of FIG. 10B and FIG. 12, may be configured by cutting of the thread groove on the terminal base part 25 and/or conductor layer 26.

As the method for manufacturing the heater plate, various methods are possible other than that described above. For example, the connection conductors 21 may be prepared by a conductive paste being filled in the recessed portions 13c and being fired simultaneously with the green base body 13 and green resistance heating element 15.

The heater according to the present disclosure is not limited to the above embodiments and may be worked in various ways.

In the embodiments, as the board-like structure, heater plates having heating functions were taken as examples. However, the board-like structure may be one having other functions. For example, the board-like structure may be an electrostatic chuck or plasma generation-use structure, or may be one functioning as a combination of two or more of these and a heater.

In other words, the internal conductor was the heating-use resistance heating element in the embodiments. However, the internal conductor may be a conductor for another purpose. For example, the internal conductor may be an electrostatic chuck-use electrode or plasma generation-use electrode. The board-like structure may have one of these electrodes and a resistance heating element or have combination of two or more of them. The internal conductor is for example a conductor which may have, as whole, a shape that may spread along the upper surface of the base body (13) (face the upper part). Further, for example, when assuming the minimum convex curve surrounding the entirety of the internal conductor when viewed on a plane, the region surrounded by the convex curve accounts for 60% or more or 80% or more of the upper surface of the base body.

In the embodiments, the connection conductor was configured so as to be positioned in only a portion of the side surface of the terminal member when viewed on a plane. However, the connection conductor may be configured to surround the terminal member when viewed on a plane.

REFERENCE SIGNS LIST

9 . . . heater plate (board-like structure), 13 . . . base body, 13a . . . upper surface, 13b . . . lower surface, 15 . . . resistance heating element (internal conductor), 21 . . . connection conductor, 23 . . . terminal part, 25 . . . terminal base part, and 26 . . . conductor layer.

The invention claimed is:

1. A board-like structure comprising:
   an insulating base body comprising an upper surface and a lower surface on an opposite side to the upper surface;
   an internal conductor which runs along the upper surface and the lower surface inside the base body; and
   a terminal member at least partially positioned inside the base body, exposed at the lower surface to an external portion of the base body, and electrically connected to the internal conductor, wherein
   the terminal member comprises
      an insulating terminal base part comprising a first surface on a side of the upper surface, a second surface on an opposite side to the first surface, and a side surface connecting the first surface and the second surface, and
      a conductor layer on a surface of the terminal base part, the conductor layer comprising a first portion located on the first surface, a second portion located on the second surface, and a third portion located on the side surface, the third portion connecting the first portion and the second portion.

2. The board-like structure according to claim 1, wherein the conductor layer includes a space in which there is gas or which is a vacuum.

3. The board-like structure according to claim 1, wherein the base body is made of a ceramic, and
   the terminal base part is made of a ceramic which is common in principal ingredients to a material configuring the base body.

4. The board-like structure according to claim 1, wherein the conductor layer includes an alloy containing Ag, Cu, and Ti, and the alloy contains Ag and Cu as principal ingredients.

5. The board-like structure according to claim 1, further comprising a connection conductor which is interposed between the internal conductor and the terminal members, wherein
   the connection conductor has a length in a vertical direction longer than that of the internal conductor, and
   at least a side surface of the terminal member is connected to a side surface of the connection conductor.

6. The board-like structure according to claim 5, wherein principal ingredients are common between the internal conductor and the connection conductor.

7. The board-like structure according to claim 5, wherein, when viewed on a plane, the connection conductor is located only in a partial range of a circumferential direction centered about the terminal member and only a portion of the side surface of the terminal member is connected to the connection conductor.

8. The board-like structure according to claim 7, wherein the connection conductor comprises
   a first portion which is connected to the terminal member, and a second portion which is located on an opposite side from the terminal member relative to the first portion and has a length in a direction perpendicular to a direction of arrangement of the terminal member and the connection conductor longer than that of the first portion.

9. The board-like structure according to claim 7, wherein the connection conductor comprises a recessed portion in the side surface, the terminal member comprises a projecting portion at the side surface, and the recessed portion and the projecting portion are connected.

10. The board-like structure according to claim 9, wherein the recessed portion forms a female screw, and the projecting portion forms a male screw which is screwed with the female screw.

11. The board-like structure according to claim 7, wherein a plurality of the connection conductors which are connected to the internal conductor, surround the terminal member, and are connected to the terminal member.

12. The board-like structure according to claim 11, wherein the plurality of connection conductors include two or more connection conductors which are mutually different in at least one of cross-sectional areas when viewed on a plane or connection areas with respect to the terminal member.

13. The board-like structure according to claim 7, wherein, in the side surface of the terminal member, at least a portion in a part other than the portion connected to the connection conductor is connected to the internal conductor.

14. The board-like structure according to claim 7, wherein, in the side surface of the terminal member, at least a portion in a part other than the portion connected to the connection conductor abuts against the base body.

15. The board-like structure according to claim 7, wherein, in the side surface of the terminal member, at least a portion in a part other than the portion connected to the connection conductor faces the base body through space in which there is gas or which is a vacuum.

16. The board-like structure according to claim 5, wherein, areas of cross-sections of the connection conductor parallel to the upper surface differ according to positions in the vertical direction.

17. The board-like structure according to claim 1, wherein the terminal member is ellipse-shaped when viewed on a plane.

18. A heater system comprising:
the board-like structure according to claim 1; and
a power supply part which is electrically connected to the terminal member, wherein
the internal conductor is a resistance heating element.

19. A board-like structure comprising:
an insulating base body comprising an upper surface and a lower surface on an opposite side to the upper surface;
an internal conductor which runs along the upper surface and the lower surface inside the base body;
a terminal member at least partially positioned inside the base body, exposed at the lower surface to an external portion of the base body, and electrically connected to the internal conductor, wherein the terminal member comprises:
an insulating terminal base part, and
a conductor layer on a surface of the terminal base part;
a connection conductor which is interposed between the internal conductor and the terminal member, wherein the connection conductor has a length in a vertical direction longer than that of the internal conductor and at least a side surface of the terminal member is connected to a side surface of the connection conductor; and
the connection conductor, when viewed on a plane, is located only in a partial range of a circumferential direction centered about the terminal member and only a portion of the side surface of the terminal member is connected to the connection conductor.

* * * * *